(12) United States Patent
Mizuno et al.

(10) Patent No.: US 6,630,857 B2
(45) Date of Patent: Oct. 7, 2003

(54) SEMICONDUCTOR INTEGRATED CIRCUIT APPARATUS

(75) Inventors: Hiroyuki Mizuno, Kokubunji (JP); Koichiro Ishibashi, Warabi (JP); Susumu Narita, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/024,039

(22) Filed: Dec. 21, 2001

(65) Prior Publication Data

US 2002/0044007 A1 Apr. 18, 2002

Related U.S. Application Data

(62) Division of application No. 09/390,962, filed on Sep. 7, 1999, now Pat. No. 6,380,798.

(30) Foreign Application Priority Data

Sep. 9, 1998 (JP) ............................. 10-254844
Apr. 16, 1999 (JP) ............................. 11-108916

(51) Int. Cl.[7] .................................................. H03K 3/01
(52) U.S. Cl. ...................................... 327/534; 327/391
(58) Field of Search ................................. 327/534, 535, 327/391; 326/33, 327, 365

(56) References Cited

U.S. PATENT DOCUMENTS

| 5,461,338 A | 10/1995 | Hirayama et al. | 327/314 |
|---|---|---|---|
| 5,557,231 A | 9/1996 | Yamaguchi et al. | 327/534 |
| 5,610,533 A * | 3/1997 | Arimoto et al. | 326/33 |
| 5,703,522 A | 12/1997 | Arimoto et al. | 327/534 |
| 5,726,562 A * | 3/1998 | Mizuno | 323/312 |
| 5,818,212 A | 10/1998 | Min et al. | 323/314 |
| 5,909,140 A | 6/1999 | Choi | 327/534 |
| 6,097,113 A | 8/2000 | Teraoka et al. | 307/534 |
| 6,337,593 B1 * | 1/2002 | Mizuno et al. | 327/534 |

FOREIGN PATENT DOCUMENTS

| EP | 0773448 | 5/1997 |
|---|---|---|
| JP | 7254685 A | 10/1995 |
| JP | 10-229165 A | 8/1998 |
| JP | 410229165 A * | 8/1998 |

OTHER PUBLICATIONS

IEEE Journal of Solid–State Circuits, vol. 31, No. 11, Nov. 1996, pp. 1770–1779.

* cited by examiner

Primary Examiner—Terry D. Cunningham
Assistant Examiner—Quan Tra
(74) Attorney, Agent, or Firm—Kenyon & Kenyon

(57) ABSTRACT

A semiconductor integrated circuit apparatus includes a first controlled circuit having at least one MOS transistor and a substrate bias control unit for generating a substrate bias voltage of the MOS transistor, wherein when the substrate bias control unit is set in a first mode, a comparatively large current is allowed to flow between the source and drain of the MOS transistor, while when the substrate bias control unit is set in a second mode, the comparatively large current allowed to flow between the source and drain of the MOS transistor is controlled to a current of smaller value. The value of the substrate bias applied to the first controlled circuit is larger in the second mode than in the first mode for the substrate bias of the PMOS transistor, and smaller in the second mode than in the first mode for the substrate bias of the NMOS transistor. The power supply voltage applied to the first controlled circuit is controlled to a smaller value in the second mode than in the first mode.

4 Claims, 16 Drawing Sheets

PRIOR ART

|     | vds(V) | vbb(V) |
|-----|--------|--------|
| (A) | 1.8    | 0      |
| (B) | 1.8    | -1.5   |
| (C) | 1.8    | -2.3   |
| (D) | 1.0    | -2.3   |

SEMICONDUCTOR INTEGRATED CIRCUIT APPARATUS

CROSS REFERENCE TO RELATED APPLICATION

This application is a divisional of U.S. patent application Ser. No. 09/390,962 which was filed on Sep. 7, 1999, now U.S. Pat. No. 6,380,798 and entitled "SEMICONDUCTOR INTEGRATED CIRCUIT APPARATUS, the entire disclosure of which is incorporated entirely by reference".

BACKGROUND OF THE INVENTION

1. Field of the Invention

The present invention relates to a semiconductor integrated circuit apparatus or more in particular to a semiconductor integrated circuit apparatus having a high speed and low power consumption at the same time.

2. Description of the Related Art

A CMOS circuit decreases in speed with a decrease in voltage. For the speed decrease to be complemented for, the threshold voltage of the MOS transistor (or the MIS transistor) is required to be reduced. The problem, however, is that the power consumption is increased by the subthreshold leakage current of the MOS transistor when the CMOS circuit is not in operation. A solution to this problem is described in IEEE Journal of Solid-State Circuits, Vol. 31, No. 11, November 1996, pp. 1770–1779 (hereinafter referred to as Reference 1).

The technique of Reference 1 is shown in FIG. 5. Reference characters vdd designate a power supply voltage which is 0.9 V in this prior art, vss the ground voltage, vbp is the substrate bias voltage of a PMOS, vbn the substrate bias voltage of a NMOS, numeral 200 a circuit configured with a MOS transistor, numeral 202 a substrate bias control circuit, and numeral 203 a mode signal. Generally, the potential difference between the voltage of the well or the substrate constituting the MOS transistor and the source voltage thereof is defined as the substrate bias. For our purpose, however, the absolute voltage (the potential difference with the ground voltage 0 V) of the well or the substrate constituting the MOS transistor is defined as the substrate bias.

In this conventional circuit, as the substrate bias of the MOS transistor constituting the CMOS circuit, a deeper voltage is applied when the CMOS circuit is not in operation (hereinafter referred to as the standby mode or standby state) than when the CMOS circuit is operating (hereinafter referred to as the active mode or the active state). The term "deeper substrate bias is applied" is defined as "a higher voltage is applied for the PMOS" and "a lower voltage is applied for the NMOS". When "a shallow substrate bias is applied" is said, on the other hand, it means that "a lower voltage is applied for the PMOS" and "a higher voltage is applied for the NMOS". These expressions are used in the description that follows.

In the conventional circuit described in Reference 1, voltages of 1.4 V and –0.5 V are applied as the substrate bias voltages of PMOS and NMOS in active mode, respectively, while 4.2 V and –3.3 V are applied to the PMOS and NMOS as the substrate bias voltages thereof in standby mode. When a deep substrate bias is applied thereto, the MOS transistor exhibits a substrate bias effect in which the threshold voltage thereof increases. In standby mode, therefore, the subthreshold leakage current decreases than in active mode.

The reduction in power consumption in standby mode by use of the substrate bias in the conventional circuit has the following problems:

(1) Although the threshold voltage is changed in standby mode and active mode by the substrate bias effect, the dependence of the threshold voltage on the substrate bias generally decreases with the decrease in the gate length (Lg) of the MOS transistor.

(2) Generally, the CMOS circuit operates at higher speed with a smaller substrate bias effect, and therefore, designing a MOS transistor with an increased substrate bias effect in order to reduce the subthreshold leakage current in standby mode is conflicting.

(3) For the threshold voltage to change more between standby mode and active mode, a deeper substrate bias is applied. The application of a deeper substrate bias, however, causes a larger drain-well or well—well potential difference of the MOS transistor, thereby leading to a larger junction leakage current in the PN junction.

The present inventors have discovered that once a substrate bias to some depth is applied to the a MOS transistor having a small gate oxide thickness (gate insulating film), the leakage current is not decreased even when a deeper substrate bias is applied thereto. Rather, a junction leakage current called the gate-induced drain leakage (GIDL) current comes to flow in the PN junction, often resulting in an increased leakage current for an increased power consumption in standby mode.

FIG. 19 is a diagram showing the gate voltage (Vgs) dependency of the drain current (Id) of the MOS transistor having a small gate oxide thickness. In a region with a large drain-gate voltage, the leakage current called the GIDL current flows from the drain to the substrate.

The curve A indicates the dependency characteristic in the case where the drain voltage (Vds) is 1.8 V and no substrate bias is applied (Vbb=0 V). The drain current (Id) with the gate voltage (Vgs) of 0 is the leakage current flowing while the transistor is in off state. The subthreshold leakage current flows in the case where Vgs is almost 0 V.

The curve B indicates the dependency characteristic in the case where Vds=1.8 V and a small amount of substrate bias is applied, e.g. in the case where a voltage Vbb of –1.5 V is applied to the substrate. In this case, the substrate bias effect reduces the subthreshold leakage current. With the curve B, the magnitude of the leakage current flowing when the transistor is in off state is determined by the subthreshold leakage current.

The curve C indicates the dependency characteristic in the case where Vds is 1.8 V and the substrate bias is applied more deeply, for example, in the case where Vbb=–2.3 V. In this case, the substrate bias effect reduces the subthreshold current on the one hand, while the GIDL current increases on the other hand. For the curve C, the GIDL current is a controlling leakage current flowing when the transistor is in off state. The application of a deeper substrate bias undesirably increases the leakage current with the transistor off as compared with when a shallower bias is applied (curve B).

In this way, with a MOS transistor having a small gate oxide thickness, it has been found that application of a substrate bias deeper than a predetermined level cannot reduce the leakage current but rather increases it due to the GIDL current against the past belief. Depending on the transistor profile (such as the impurities concentration of the diffusion layer), the GIDL current for the MOS transistor having a gate oxide thickness of not more than 5 nm increases to a non-negligible degree, and therefore the range of the substrate bias that can be applied is limited correspondingly. Thus, in the prior art, the effect of reducing the leakage current of the MOS transistor having a small gate oxide thickness is unavoidably limited.

(4) The subthreshold leakage current and the leakage current in the PN junction makes it difficult to conduct the IDDQ test for screening out defective products according to the current flowing in the circuit.

SUMMARY OF THE INVENTION

In a MOS transistor with a thin gate oxide having the gate voltage (Vgs) dependency of the drain current (Id) in off state as described above, the mere application of a deep substrate bias has no sufficient effect of reducing the leakage current. In FIG. 19, the curve D indicates the dependency characteristic in the case where a deep substrate bias is applied (Vbb=−2.3 V) and the drain voltage (Vds=1.0 V) is further reduced. By decreasing the power supply voltage in this way, a deep substrate bias can be applied to the well while limiting the voltage applied between the diffusion layer and the well of the MOS transistor to a small value (3.3 V in this case). Further, the following characteristics are obtained.

(1) Since the electric field amount applied to the gate oxide film is so small that the GIDL current is reduced when Vgs is 0 V or thereabouts.

(2) With the decrease in drain voltage, the drain induced barrier lowering (DIBL) effect increases the threshold voltage of the MOS transistor. In this case, the substrate bias is applied and therefore the DIBL effect is enhanced. (In FIG. 19, comparison between curves C and D shows that the leakage current is generally smaller, the lower the voltage Vds.)

Utilizing this dependency characteristic, the leakage current can be remarkably reduced when a transistor having a thin gate oxide is in off state. For realizing these substrate bias conditions with each MOS transistor when the chip is in standby mode, the power supply voltage of the transistor is required to be reduced below a normal operation level to further deepen the substrate bias to be applied.

According to a method disclosed in JP-A-7-254685 laid open Oct. 3, 1995, the substrate bias voltage is controlled to reduce the subthreshold current by increasing the absolute value of the threshold level of the transistor in standby mode and at the same time, the power supply voltage of the transistor is reduced in order to reduce the gate leakage current and the band—band tunnel leakage current. In this well-known method, however, each means involved is recognized to have an independent effect, but the fact fails to be recognized that these means have a synergistic effect of reducing the leakage current effectively in a thin-film transistor. Also, in the disclosed patent publication, an internal power supply voltage determined by the hot electron effect (Intvcc+Δ) higher by Δ than the internal power supply voltage Intvcc for the other conventional methods is applied in active mode, while the internal power supply voltage is set to a value near VccMIN (Intvcc−Δ') in standby mode. As a result, this circuit operates at higher speed than the other conventional circuits in active mode and decreases in power in standby mode. The only recognition in this method is that the scope of change (Δ+Δ') of the internal power supply voltage is changed within the range of the operating power supply voltage of the internal circuit.

on the other hand, JP-A-10-229165 laid open Aug. 25, 1998, discloses a method in which both the substrate bias voltage and the power supply voltage are controlled in standby mode, so that the change rate of the substrate bias voltage is reduced for changing the threshold voltage. This conventional method also fails to recognize that the means mentioned above, when included in a thin-film transistor, have the synergistic effect of reducing the leakage current, but discloses a technique of changing the change amount by controlling the substrate bias voltage and the power supply voltage instead of by changing the substrate bias voltage alone.

In order to solve the problems described above, according to the present invention, there is provided a semiconductor integrated circuit apparatus comprising a first controlled circuit including at least a MOS transistor, and substrate bias control means for generating the substrate bias voltage of the MOS transistor, wherein the substrate bias control means is set in first mode thereby to allow a comparatively large current to flow between the drain and source of the MOS transistor while the substrate bias control means is set in second mode thereby to control the comparatively large current between the drain and the source of the MOS transistor to a smaller value, the first controlled circuit being impressed with a higher substrate bias voltage in second mode than in first mode for the PMOS transistor and impressed with a lower substrate bias voltage in second mode than in first mode for the NMOS transistor, the first controlled circuit being impressed with a lower power supply voltage in second mode than in first mode.

Further, a third mode is defined, and the substrate bias control means is set in second or third mode thereby to control the comparatively large current between the drain and source of the MOS transistor to a smaller value. In the process, the first controlled circuit is impressed with a higher substrate bias voltage in second and third modes than in first mode for the PMOS transistor and a lower substrate bias voltage in second and third modes than in first mode for the NMOS transistor.

A lower power supply voltage may be applied to the first controlled circuit in second mode than in first mode and the same power supply voltage may be applied to the first controlled circuit in third mode as in first mode.

According to another aspect of the invention, there is provided a semiconductor integrated circuit apparatus comprising a second controlled circuit and second power supply voltage control means for controlling the power supply voltage of the second controlled circuit, wherein in first mode, the second power supply voltage control means allows a comparatively large current to flow between the drain and source of the MOS transistor in the second controlled circuit, and in second mode, the second power supply voltage control means controls the comparatively large current between the drain and source of the MOS transistor in the second controlled circuit to a smaller value, the second controlled circuit being impressed with a lower power supply voltage in second mode than in first mode.

In the process, the substrate bias of the MOS transistor in the second controlled circuit may be controlled by the substrate bias control means to a voltage value higher in second and third modes than in first mode for the PMOS transistor and to a voltage value lower in second and third modes than in first mode for the NMOS transistor.

Also, the controlled circuit preferably includes a data path circuit wherein the data flow is preferably parallel between the data path circuit and the power net of the lowermost metal wire layer in the data path circuit of the power line controlled by the second power supply voltage control means.

In numerical terms, the threshold voltage of the MOS transistor constituting the first controlled circuit may be not more than 0.5 V, the power supply voltage of the first controlled circuit in second mode may be not more than 1.0

V but not less than 0.5 V, and the threshold voltage of the MOS transistor constituting the second controlled circuit may be not more than 0.5 V.

Further, the power line of the second controlled circuit controlled by the second power supply voltage control means is not more than 0.5 V in second mode. The power line of the second controlled circuit controlled by the second power supply voltage control means preferably has an impedance at least five times as large in second mode as in first mode.

According to still another aspect of the invention, there is provided a semiconductor integrated circuit apparatus comprising a controlled circuit including a MIS transistor, a first control circuit for controlling the substrate bias voltage of the MIS transistor, a second control circuit for controlling the power supply voltage of the MIS transistor, and mode signal input means for controlling the mode of the controlled circuit, wherein the first and second control circuits are controlled by one or a plurality of control signals formed based on the mode signal produced from the mode signal input means.

Also, the apparatus comprises a controlled circuit including a MIS transistor, a first control circuit for controlling the substrate bias voltage of the MIS transistor, and a second control circuit for controlling the drain-source voltage of the MIS transistor, wherein the first control circuit is set in first mode thereby to allow a comparatively large current to flow between the drain and source of a MOS transistor, the first control circuit is set in second mode thereby to control the comparatively large current between the drain and source of the MOS transistor to a smaller value, and the second control circuit controls the drain-source voltage of the MOS transistor to assume a low value at least during a part of the period when the first control circuit is set in second mode.

Also, from the viewpoint of wiring in the circuit, there is provided a semiconductor integrated circuit apparatus including a CMOS transistor circuit, first and second virtual power voltage lines connected to the source-drain circuit of the CMOS transistor, a first substrate bias line for controlling the substrate bias voltage of the PMOS transistor constituting the CMOS transistor circuit, a second substrate bias line for controlling the substrate bias voltage of the NMOS transistor constituting the CMOS transistor circuit, and a control circuit for controlling the potential difference between the first and second virtual power voltage lines downward while at the same time controlling the potential difference between the first and second substrate bias lines upward for a predetermined period of time.

In the process, the apparatus may comprise a first power supply voltage line connected to the first virtual power voltage line through a first switch and connected to the second virtual power voltage line through a third switch, and a second power voltage line connected to the second virtual power voltage line through a third switch and connected to the third substrate bias line through a fourth switch.

In a more specific layout, a switch cell including first to fourth switches and a plurality of cells including a CMOS transistor may be arranged along the first and second virtual power voltage lines and the first and second substrate bias voltage lines. At the same time, the first and second virtual power voltage lines and the first and second substrate bias voltage lines are arranged in parallel to each other, while the first and second power voltage lines are arranged in a position perpendicular thereto, and the switch cell can be arranged at a position nearer to the first and second power voltage lines than to the cells.

As another example, there is provided a semiconductor integrated circuit apparatus comprising a CMOS transistor circuit, first and second lines connected to the source-drain circuit of a CMOS transistor, a first substrate bias line for controlling the substrate bias voltage of the PMOS transistor constituting the CMOS transistor circuit, a second substrate bias line for controlling the substrate bias voltage of the NMOS transistor constituting the CMOS transistor, and a control circuit for controlling the potential difference between the first and second lines downward while at the same time controlling the potential difference between the first and second substrate bias lines upward for a predetermined period of time.

As still another example, there is provided a method of controlling a semiconductor integrated circuit apparatus comprising a MIS transistor, comprising the steps of performing a first operation for reducing the sub-threshold leakage current flowing between the drain and source of a MOS transistor by controlling the substrate bias voltage of a MIS transistor, and performing a second operation for reducing the drain-source voltage of the MIS transistor, wherein the period of the first operation is at least partially overlapped with the period of the second operation.

As a further developed example, there is provided a semiconductor integrated circuit apparatus comprising first and second circuit blocks including a CMOS transistor circuit, wherein each block includes first and second lines connected to the source-drain circuit of the CMOS transistor, a first substrate bias voltage line for controlling the substrate bias voltage of the PMOS transistor constituting the COMS transistor circuit, and a second substrate bias voltage line for controlling the substrate bias voltage of the NMOS transistor constituting the CMOS transistor, wherein the first circuit block is controlled for a predetermined period of time in such a manner that the voltage supplied to at least one of the first and second lines undergoes a change for predetermined period of time and the potential difference between the first and second substrate bias lines increases for a predetermined period of time, and the second circuit block interrupts the voltage supplied to at least one of the first and second lines for a predetermined period of time.

These and other objects, features and advantages of the present invention will become apparent in view of the following detailed description of the preferred embodiments in conjunction with the accompanying drawings.

DESCRIPTION OF THE PREFERRED EMBODIMENTS

Figure 1A:
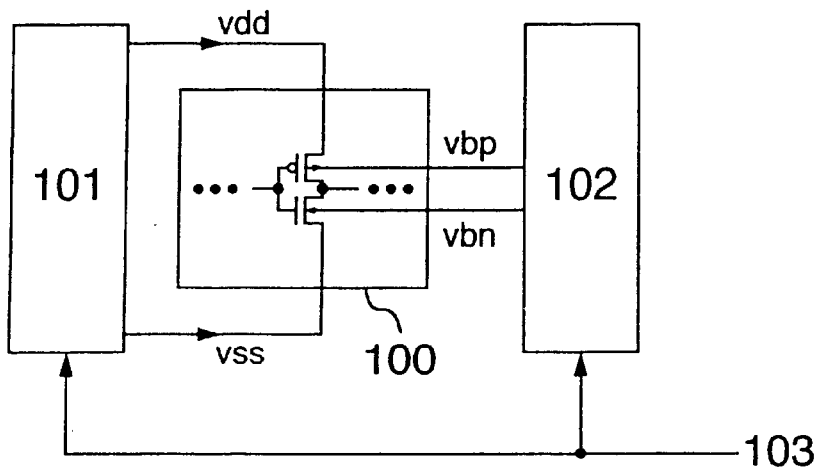
FIGS. 1A, 1B are diagrams showing a most basic embodiment of the present invention.
Figure 1B:
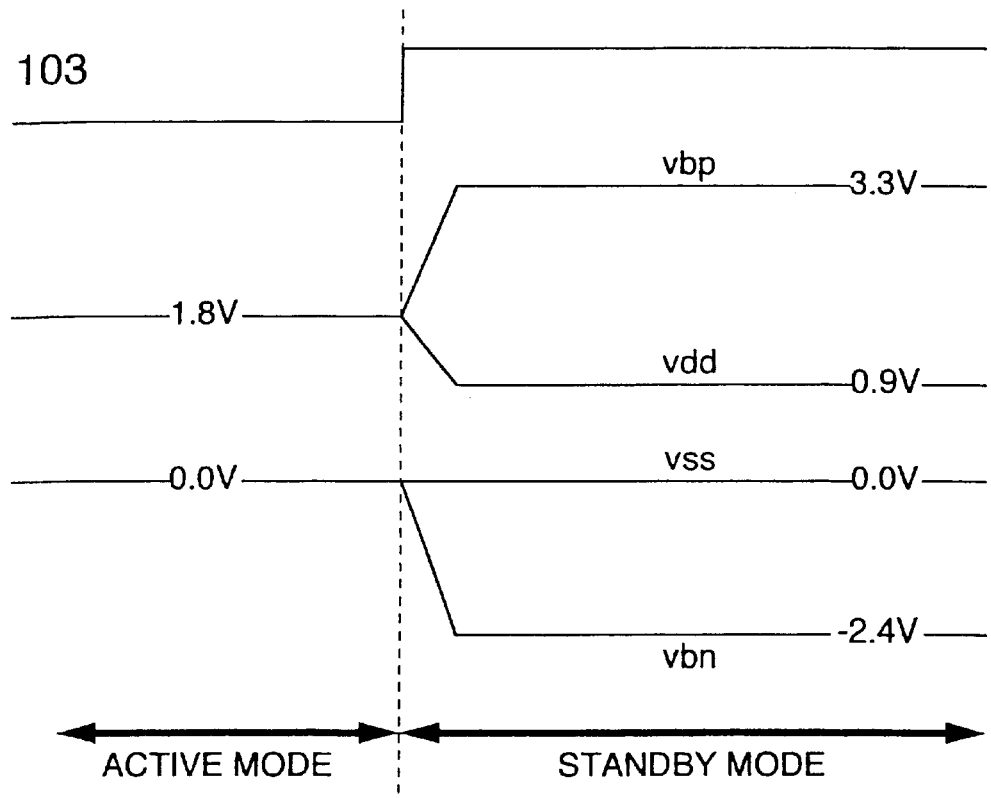

FIGS. 1A, 1B show a basic embodiment of the invention. Reference characters vdd designate a power supply voltage, vss a ground voltage, vbp a substrate bias voltage of a PMOS, vbn a substrate bias voltage of a NMOS, numeral 100 a circuit including a MOS transistor, numeral 101 a power supply voltage control circuit, numeral 102 a substrate bias control circuit, and numeral 103 a mode signal.

When the mode signal line 103 is "L", a voltage of 1.8 V is applied as vdd and a voltage of 0 V as vss by the power supply voltage control circuit 101. Also, a voltage of 1.8 V is applied as vbp and a voltage of 0 V as vbn by the substrate bias control circuit 102. Thus, the circuit 100 enters an active mode and become capable of high-speed operation.

In the case where the mode signal 103 is "H", on the other hand, a voltage of 0.9 V is applied as vdd and 0 V as vss by the power supply voltage control circuit 101. Also, a voltage of 3.3 V is applied as vbp and a voltage of −2.4 V as vbn by the substrate bias control circuit 102, so that the circuit 100 enters a standby mode. In this mode, (1) the substrate bias voltage is deeper than the source potential of each MOS transistor, and therefore the threshold voltage of the MOS transistor in the circuit 100 increases due to the substrate bias effect, and (2) the drain voltage drops, and therefore the threshold voltage of the MOS transistor in the circuit 100 increases due to the drain induced barrier lowering (DIBL) phenomenon.

These two effects can suppress the increased power consumption due to the subthreshold leakage current considerably more than in standby mode of the prior art. Further, the DIBL phenomenon is larger, the shorter the gate length Lg, and therefore the advance of miniaturization correspondingly increases the effect.

The present invention utilizes the synergistic effect of the control of the supply voltage and the substrate bias. As long as there is a period during which the mode of a reduced drain-source voltage is overlapped with the mode of a deep substrate bias voltage, the effect of reducing the subthreshold leakage current can be obtained to that extent. Either one of the supply voltage value and the substrate bias value can be changed for transition to each mode at an earlier timing than the other.

What should be noted here is that the malfunction of the circuit 100 is desirably prevented during the transition to each mode. It is effective, for example, to control to assure the transition to each mode only after complete stop of the operation of the circuit 100. The supply voltage and the substrate bias value undergo a change and so does the delay characteristic, etc. of the circuit 100 during the transition. In the case where the circuit 100 has a sufficient operating margin against these voltage variations, the transition to each mode is possible while the circuit 100 is in operation. Normally, however, transition to each mode while the circuit 100 is in operation is often a cause of malfunction.

In the case where the operation of the circuit 100 is guaranteed only by the power supply voltage and the substrate bias value in active mode, it is necessary that the circuit 100 begins to operate, at the time of transition from standby mode to active mode, only after detecting that both the power supply voltage and the substrate bias have been established at the value for active mode. This detection may be determined by monitoring each voltage value or a timer or the like may be used to wait until each voltage reaches a predetermined value. Either method can prevent the malfunction of the circuit 100.

Figure 2:
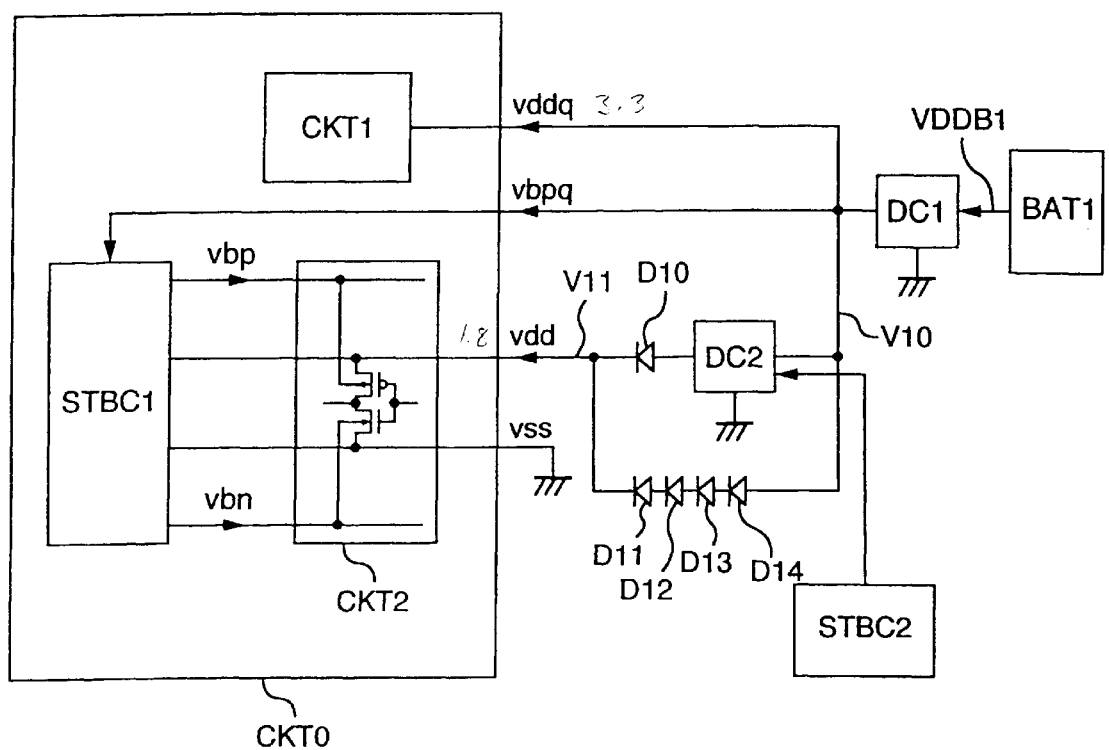
FIG. 2 is a diagram showing a more specific embodiment of the invention.

FIG. 2 shows a specific embodiment of the invention. In this embodiment, a circuit CKT0 includes a high-voltage circuit block CKT1 and a low-voltage circuit block CKT2. The high-voltage circuit block CKT1 and the low-voltage circuit block CKT2 have different operating voltages in active mode. Also, this embodiment is configured in such a manner that only the substrate bias voltage of the MOS transistor constituting the low-voltage circuit CKT2 can be controlled whereas the substrate bias voltage of the MOS transistor making up the high-voltage circuit CKT1 is not controlled.

Characters vddq, vdd designate power supply voltages which are applied as 3.3 V and 1.8 V, respectively, in active mode. Characters vss designate the ground voltage, vbpq a power supply voltage applied as the substrate bias of the PMOS in standby mode, and though not specifically limited, is 3.3 V like vddq in the case under consideration. Characters vbp designate the substrate bias voltage of the PMOS, and vbn the substrate bias voltage of the NMOS. Characters STBC1 designates a substrate bias control circuit for controlling the substrate bias of the circuit CKT2 made up of a MOS transistor, BAT1 a battery, DC1, DC2 DC—DC converters, STBC2 a standby control circuit, and D10 to D14 diodes.

First, the power supply system of FIG. 2 will be described. The substrate bias control circuit STBC1 is supplied with the power supply voltage vbpq for generating a substrate bias voltage for standby mode as boosted by the battery BAT1 through the DC—DC converter DC1. This voltage is the same 3.3 V as the voltage vddq. The high-voltage circuit CKT1 includes a circuit operated at 3.3 V supplied from the vddq terminal. Further, the power supply voltage of the low-voltage circuit CKT2 is supplied from the vdd terminal, which in turn is supplied, through a diode D10, with the 3.3-V power supply voltage (V10) boosted by the DC—DC converter DC1 and stepped down by the DC—DC converter DC2. The step-down voltage of the DC—DC converter DC2 is set so that the vdd value is 1.8 V. A path including the DC—DC converter DC2 and the diode D10 is connected in parallel to a path including diodes D11 to D14.

Now, the substrate bias system will be explained. The substrate biases vbp, vbn of the MOS transistors in the circuit CKT2 are controlled by the substrate bias control circuit STBC1. The substrate biases of the MOS transistors in the high-voltage circuit CKT1 and the substrate bias control circuit STBC1 are not specifically limited.

The signal lines other than for the signals of the power supply system and the substrate bias system described above are not shown in FIG. 2, and the configuration thereof is not specifically limited.

Figure 3:
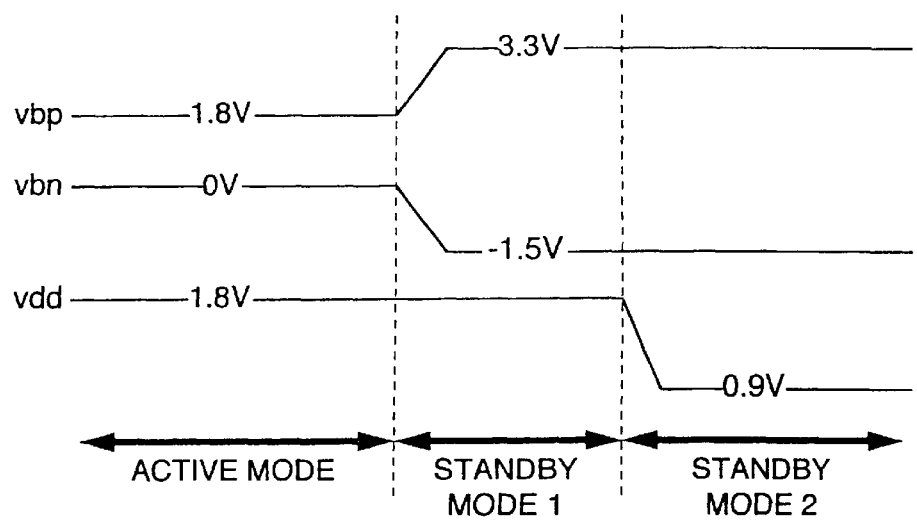
FIG. 3 is a diagram showing control waveforms for FIG. 2.

FIG. 3 shows a control method for the circuit included in the embodiment FIG. 2 in active mode and standby mode. When the circuit CKT2 is in active mode, a voltage of 1.8 V is supplied to the power supply voltage terminal vdd of the circuit CKT2. This voltage of 1.8 V is supplied by stepping down, through the diode DC10, the voltage generated in the DC—DC converter DC2. The voltage drop V6 due to one diode is about 0.6 V. Thus, the voltage drop across the three diodes D11 to D14 is 2.4 V. Therefore, the diodes D11 to D4 turn off in the case where the DC—DC converter DC2 operates in such a manner that the voltage V11 is 1.8 V. On the other hand, voltages of 1.8 V and 0 V are applied by the substrate bias control circuit STBC1 as the substrate biases vbp, vbn of the MOS transistors making up the circuit CKT2.

As long as the circuit CKT2 is in standby mode 1, the power supply voltage terminal vdd of the circuit CKT2 is supplied with 1.8 V as in active mode. As substrate biases vbp, vbn of the MOS transistors constituting the circuit CKT2, on the other hand, voltages of 3.3 V and −1.5 V are applied, respectively, by the substrate bias control circuit STBC1. Since the threshold voltage of the MOS transistors making up the circuit CKT2 is increased by the substrate bias effect, the increase in the power consumption due to the subthreshold leakage current of the circuit CKT2 can be suppressed.

When the circuit CKT2 is in standby mode 2, on the other hand, the standby control circuit STBC2 turns off the DC—DC converter DC2 and thus stops supplying the power of 1.8 V through the diode D10. As a result, the voltage V11 drops. Since the path including the diodes D11 to D14 turn on, however, the voltage V11 does not drop below 0.9 V (=3.3 V−0.6 V×4), thus supplying the voltage of 0.9 V to the power supply voltage terminal vdd of the circuit CKT2. Voltages of 3.3 V and −1.5 volts are applied by the substrate bias control circuit in the same manner as in standby mode 1, as the substrate bias voltages vbp, vbn, respectively, of the MOS transistors making up the circuit CKT2.

As described previously, the subthreshold leakage current of the MOS transistor with a short gate length (Lg) has a feature due to what is called the drain induced barrier lowering (DIBL) effect, as follows.

(1) the leakage current changes exponentially in proportion to the drain voltage as well as the gate voltage, and.

(2) with the increase in the depth of the substrate bias, the drain voltage dependency increases.

In standby mode 2 shown in FIG. 3, (1) the drain voltage of the MOS transistors in the circuit CKT2 is lower than in standby mode 1, and (2) the substrate bias voltage of the PMOS is 2.4 V (=3.3 V−0.9 V) as compared with 1.5 V (=3.3 V−1.8 V) for standby mode 1.

Figures 19A, 19B:
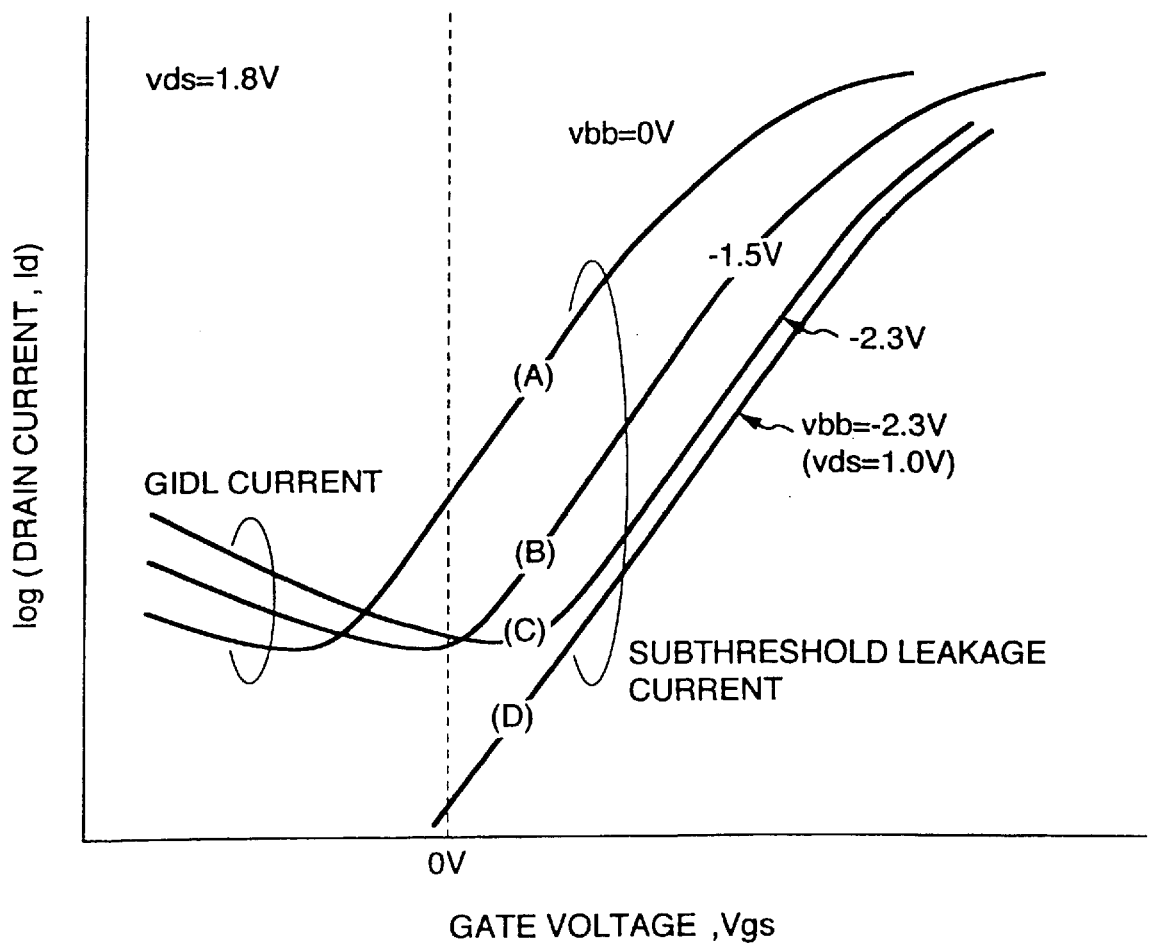
FIGS. 19A and 19B are diagrams showing the gate voltage (Vgs) dependency of the drain current (Id) of a MOS transistor having a small gate oxide thickness.

In standby mode 2, the DIBL effect increases due to the facts (1) and (2) described above, and therefore the increase in power consumption of the circuit CKT2 due to the subthreshold leakage current can be suppressed more than in standby mode 1. The leakage current can be reduced in standby mode 2 also due to the fact that no GIDL current flows when the transistor is in off state as shown in FIGS. 19A, 19B.

Figure 4:
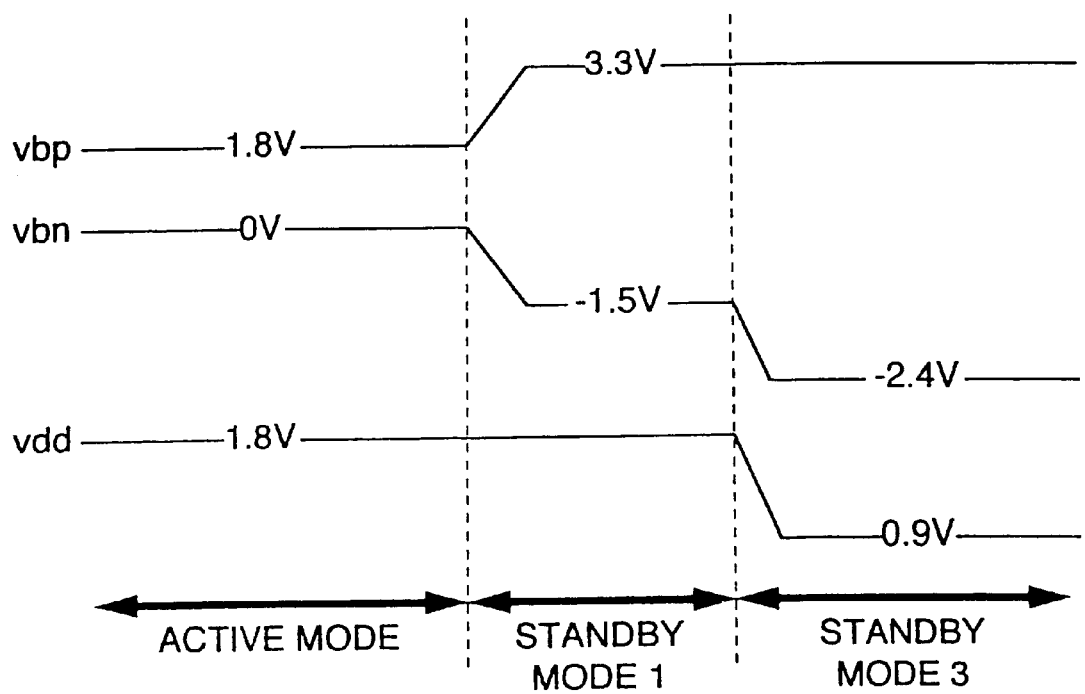
FIG. 4 is a diagram showing an example of control different from FIG. 3.
Figure 5A:
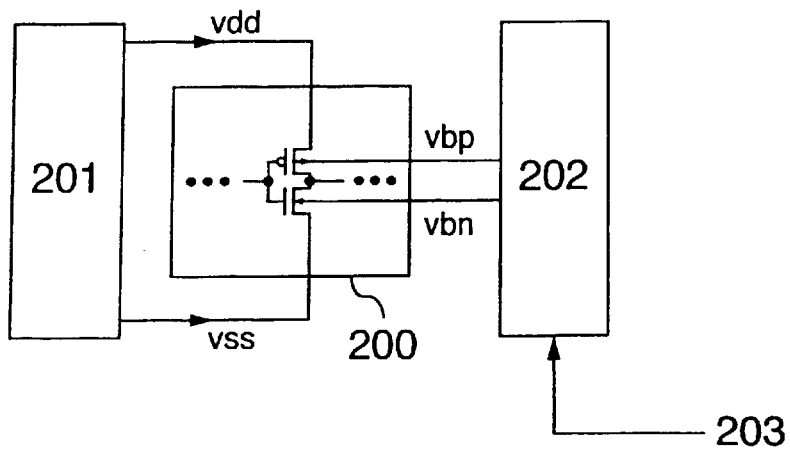
FIGS. 5A, 5B are diagrams showing the prior art.
Figure 5B:
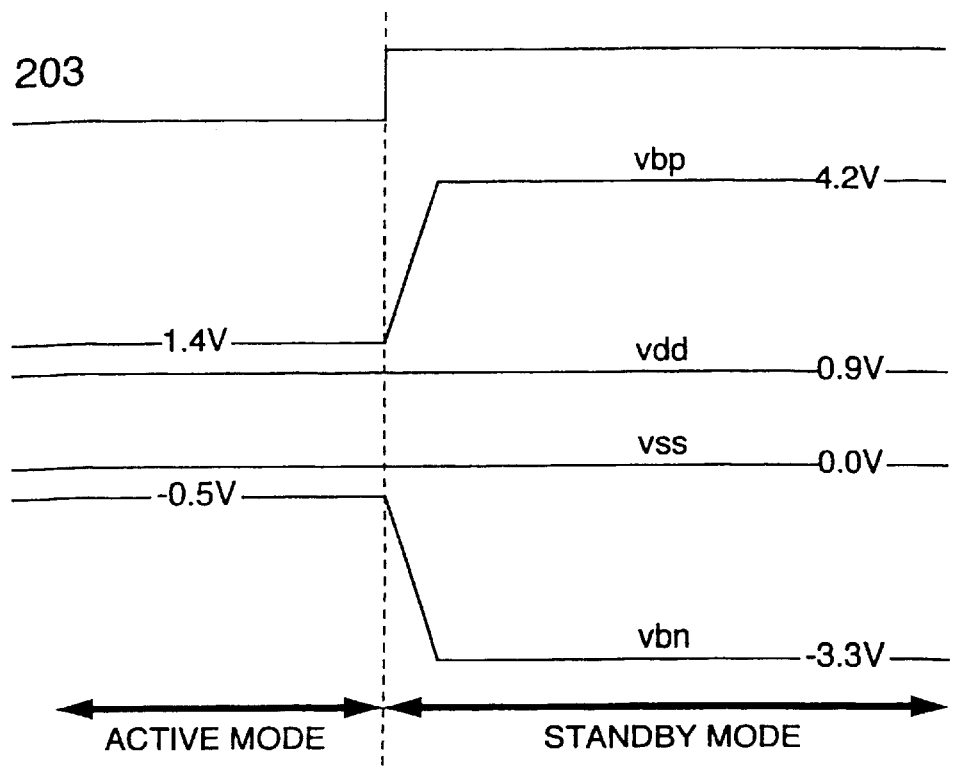

FIG. 4 shows another embodiment. In FIG. 3, the substrate bias voltages vbp, vbn in standby mode 2 are controlled to the same value as in standby mode 1. In the embodiment of FIG. 4, the substrate bias voltage vbn of the NMOS is controlled in standby mode 3 to a deeper value (−2.4 V) than the value (−1.5 V) for standby mode 2. This control operation can be realized by designing the substrate bias control circuit STBC1 to monitor the vdd voltage and vbpq voltage and thereby to generate the substrate bias voltages vbp, vbn. By doing so, a deeper substrate bias voltage is applied in standby mode 3 of FIG. 4 than in standby mode 2 of FIG. 3. In standby mode 3 of FIG. 4, (1) the drain voltage of the MOS transistors in the circuit CKT2 is lower than in standby mode 1, and (2) the substrate bias voltage of the PMOS is 2.4 V (=3.3 V−0.9 V) as compared with 1.5 V (=3.3 V−1.8 V) for standby mode 1, and further, the substrate bias voltage of the NMOS is −2.4 V as compared with −1.5 V in standby mode 1.

In standby mode 3, as seen from the facts (1) and (2) described above, the increase in power consumption of the circuit CKT2 due to the subthreshold leakage current can be suppressed more than in standby mode 2 of FIG. 3.

Especially in standby mode 3, a deeper substrate bias voltage is applied than in standby mode 1 to the MOS transistors in the circuit CKT2 as described in (2) above. Nevertheless, the drain-well or well—well voltage of the MOS transistor remains the same as in standby mode 1 since the power supply voltage vdd is reduced. Thus, no large potential difference occurs between drain and well or between well and well of the MOS transistor by the application of the deep substrate bias voltage. The resulting effect is that a deep substrate bias can be applied without increasing the leakage current flowing in the PN junction.

The circuit CKT1 of FIG. 2 is suitably used as an I/O circuit for exchanging the signals between the circuit CKT0 and other devices installed externally to the circuit CKT0. The I/O voltage is required to have a value within a range predetermined with the external device, and therefore an inconvenience results unless the I/O voltage assumes a certain voltage value even in the case where the vdd voltage undergoes a change in standby mode 2 or 3. The vddq voltage of 3.3 V, which remains unchanged in standby mode 2 or 3, can be used as a power supply voltage for the I/O circuit.

As described above, according to this invention, the substrate bias voltage is applied deeper in standby mode than in active mode and the power supply voltage supplied to the circuit is decreased. Thus, unlike in the prior art in which the substrate bias voltage is simply applied in standby mode, the subthreshold leakage current can be remarkably reduced by the effect of the DIBL phenomenon. Further, a deeper substrate bias can be obtained than in the prior art without greatly increasing the potential difference of the PN junction between drain and well or between well and well of the MOS transistor (i.e. without increasing the leakage current of the PN junction). Also, in addition to the fact that the subthreshold leakage current can be reduced by raising the threshold voltage due to the substrate bias effect, the deep substrate bias voltage can further enhance the effect of reducing the subthreshold leakage current due to the DIBL phenomenon described above. Also, the increase in the leakage current due to the GIDL current can be suppressed.

The value of the substrate bias voltage with the power supply voltage reduced is not specifically limited. What is required is to apply a deeper substrate bias voltage in the standby mode when the power supply voltage is low, than in active mode.

The power supply voltage lowered in standby mode can assume such a value that the contents stored in the memory circuit (such a circuit as a latch, SRAM or a register which stores information) in the circuit to which the particular power supply voltage is applied. As an alternative condition, the voltage value has a sufficient endurance against the software error. An excessively low power supply voltage makes it difficult to hold the data stored in memory, and therefore, it is set to 0.9 V in the embodiment of FIGS. 1 and 2. This minimum voltage value is dependent also on the threshold voltage of the MOS transistor making up the circuit and therefore is not specifically limited herein.

As the result of setting the power supply voltage to a value capable of holding the data stored in the memory circuit, complete restoration of the state before transition to the standby mode can be assured at the time of transition from standby mode 2 or standby mode 3 to active mode. The transition time between standby mode and active mode can thus be shortened.

Further, in standby mode 2 or 3, the subthreshold leakage current or the PN junction leakage current (including the GIDL current) is so small that the IDDQ test can be easily conducted for selecting a semiconductor integrated circuit apparatus of the circuit CKT0 based on the value of the current flowing in the power supply vdd. By the way, another conceivable method of eliminating the effect of the PN junction leakage current is by measuring and calculating the power supply current for the IDDQ test based on the measurement of the substrate current flowing in the substrate at the same time. The method according to this invention described below, however, can easily implement the execution of the IDDQ test.

The IDDQ test is defined as a method for detecting the presence or absence of a defect or fault by measuring the power supply current of a chip when the transistor is not in switching operation and in stationary state. In the absence of a detect, only a slight amount of current flows, but in the presence of a defect, a large current flows in the stationary state of the transistor. This test method, as compared with the mainstay of the function test of the LSI, has the feature that many faults can be detected with a small number of patterns. The present inventors discovered, however, that the conventional IDDQ test has the following problems.

(A) In the LSI configured with a transistor of low threshold level, the leakage current due to the subthreshold leakage current flows even in stationary state when the transistor is not turned on. Thus, the current due to a fault and the leakage current due to the subthreshold leakage current cannot be distinguished from each other, thereby making it difficult to conduct the IDDQ test. In the method of reducing the leakage current due to the subthreshold leakage current by applying the substrate bias voltage at the time of the IDDQ test, on the other hand, the IDDQ test is also made difficult to conduct due to the leakage current (including the GIDL current) in the PN junction.

(B) As compared with the function test, a longer time is required for measuring the IDDQ test and therefore the test cost is increased.

The problem of (A) can be solved by measuring the current in standby mode 2 or standby mode 3 in the IDDQ test according to this invention (hereinafter called the IDDQ current measurement method of the invention). This method facilitates the detection of a fault due to an increased ratio between the current flowing in the power supply vdd at the time of a fault and the current flowing in the power supply vdd in normal state.

The aging test, on the other hand, consists in applying a voltage higher or sometimes lower than normal to the chip to cause an initial defect to make a forcible appearance from the chip under severe conditions. The temperature and other conditions for the aging test are not specifically limited here. The aging test is conducted either by activating or not activating the chip, to either of which the invention is not specifically limited. The aging test should be assumed to be identical to what is called the accelerated test or the burn-in test.

Another method is to apply or not to apply the substrate bias voltage at the time of aging, to either of which the invention is not specifically limited. The subthreshold leakage current tends to increase with the temperature. The aging test at high temperatures, therefore, is conducted at the risk of a thermal runaway due to the subthreshold leakage current. The thermal runaway can be prevented by reducing the subthreshold leakage current in an aging test conducted by applying the substrate bias voltage.

The relation between the aging and the IDDQ test is in two ways described below, either of which can be selected.

(1) After the aging, the current value of the chip is measured to screen out defects.

(2) Before and after the aging, the chip current value is measured to screen out defects due to the difference in current value.

As compared with the method (1), the method (2) has the advantage that the acceleration of a latent defect can be detected easily by aging. The advantage of the method (1), on the other hand, is that a defect can be screened out in a single session of current measurement, thereby reducing the test time. The IDDQ current measuring method according to this invention can be used in both of the methods (1) and (2).

Figure 16:
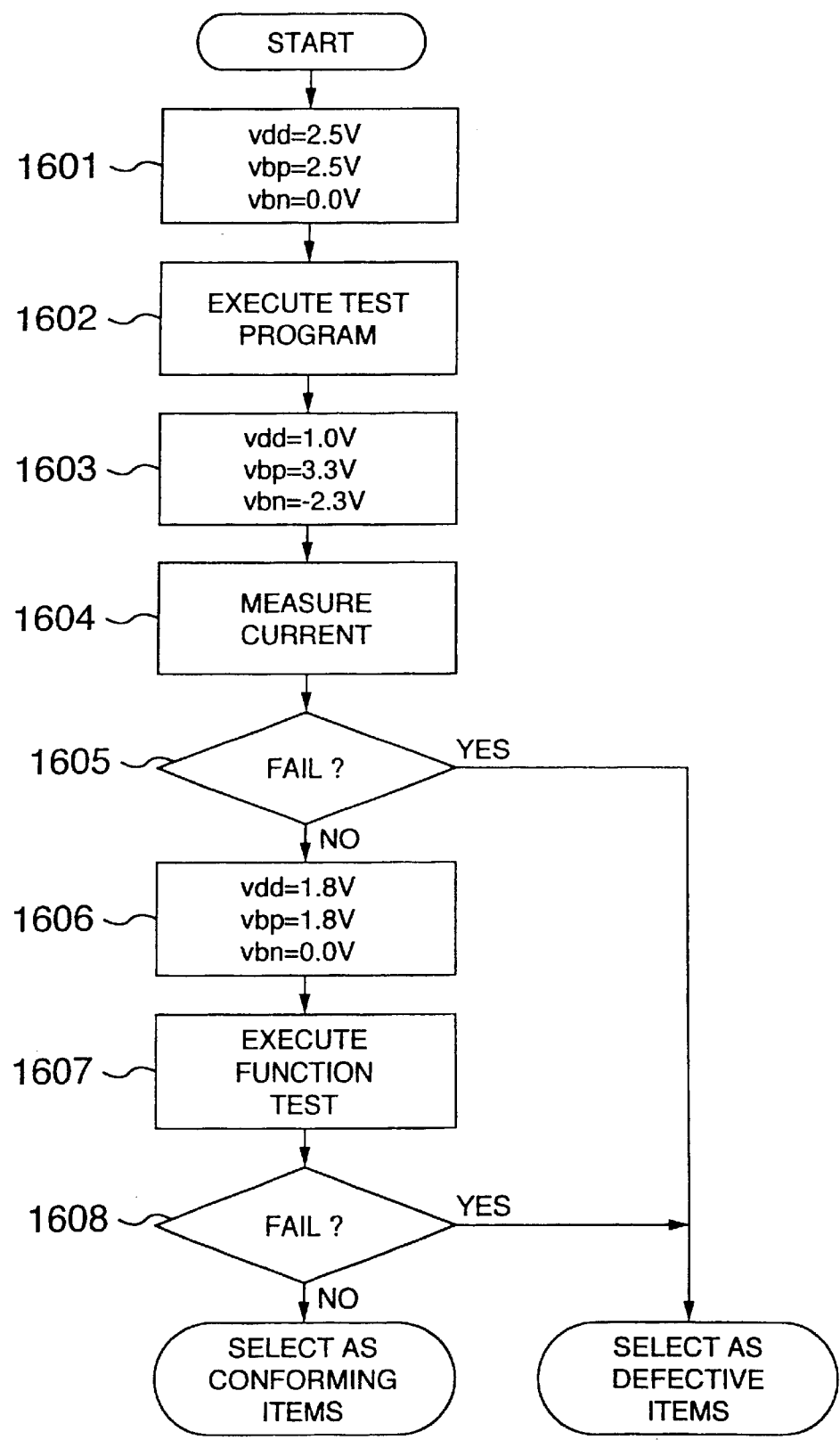
FIG. 16 is a diagram showing a chip test sequence according to an embodiment of the invention.

An example flow of the method (1) is shown in the flowchart of FIG. 16 (the method (2) can be carried out in similar fashion and therefore will not be described here). First, in steps 1601, 1602, the aging is conducted by increasing the power supply voltage to a level higher than the normal operating voltage of 1.8 V and thus a detect is forced out into appearance. Then, in steps 1603, 1604, the power supply voltage is reduced below the normal operating voltage, followed by applying the substrate bias thereby to measure the current (the IDDQ current measuring method according to the invention). In the case where the current measurement is larger than a predetermined value in step 1605, the item involved is screened out as a defective one. After that, the chips of conforming items are impressed with a normal power supply voltage in steps 1606, 1607, and further a function test is conducted thereon without applying the substrate bias. Then, in step 1608, the items are screened according to the result of the function test. The environmental conditions including the ambient temperature in steps 1601 to 107 are not specifically limited.

The chips can be selected also by executing the test program in step 1602. The execution of the test program may include the application of a test pattern to the chip prior to the IDDQ test. A test pattern can also be input using a certain kind of scan in step 1602. Further, in step 1606, the worst condition (vdd=1.6 V, for example) for the power supply voltage of the chip can be selected within the power supply voltage range for chip operation.

Furthermore, for the select operation in step 1605, a method can be employed in which a defect is determined in the case where a current larger than a predetermined absolute value flows. In the case where the semiconductor integrated circuit apparatus is fabricated in a predetermined unit of production (a lot, a wafer, etc. for example), statistics are prepared within the particular fabrication unit, so that any item exhibiting a current value statistically deviating from a reference value (a current value deviating 3 σ or more, for example) is determined as defective. Both of the methods described above may also be employed for determination. The leakage current varies considerably with the fluctuations of the threshold voltage of the MOS transistor, and hence with the fabrication units. Within the same fabrication unit, however, a comparatively uniform characteristic is exhibited, and therefore the statistical determination of a defect described above can be considered effective.

The second problem (B) of the IDDQ test can be solved to some extent by improving the current measuring instrument such as the IC tester for measuring the power supply current of the chip. In the case of changing the substrate bias prior to the IDDQ test, however, it is necessary to newly allow for the time of driving the substrate. When the substrate voltage is generated in a particular chip (in the case where a voltage generating circuit is included in the substrate bias control circuit STBC1, for example, in FIG. 1), it takes a comparatively long time to drive the substrate to the desired voltage since the driving capacity of the voltage generating circuit in the chip is not generally large enough.

Figure 17:
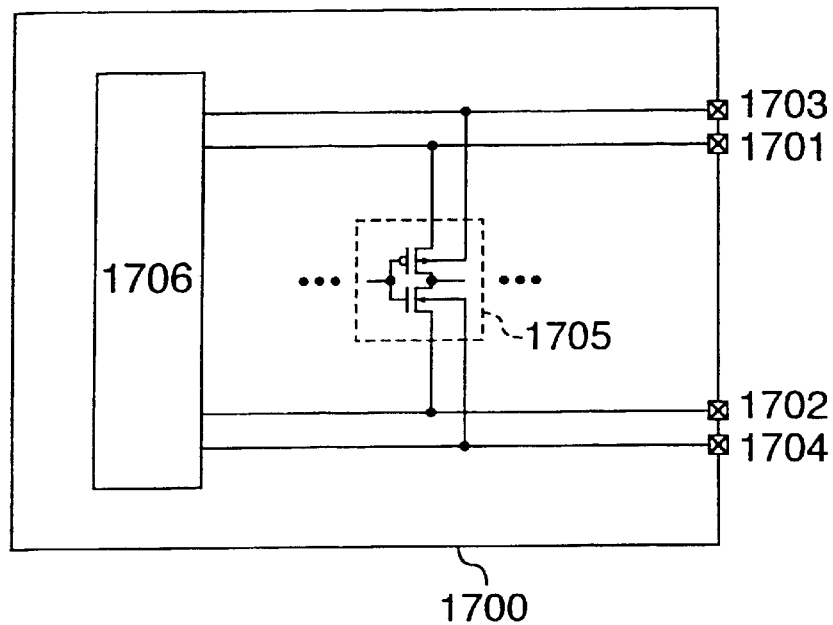
FIG. 17 is a diagram showing a chip terminal structure according to an embodiment of the invention.

In order to solve this problem, the embodiment of FIG. 17 is configured to supply the power for the substrate bias also from outside of the chip. In FIG. 17, numeral 1700 designates the chip. The chip 1700 includes pads for substrate bias 1703, 1704 in addition to pads for power supply 1701, 1702.

The pads for power supply 1701, 1702 are connected to the power supply terminal of the circuit, and the pads for substrate bias 1703, 1704 are connected to the substrate terminal of the transistors constituting the circuit. Numeral 1706 designates a part, though not always required, corresponding to the substrate bias control circuit STBC1 of FIG. 2. This part constitutes an internal substrate bias control circuit built in the chip. Numeral 1705 designates an example of the internal circuit of the chip, which is a CMOS inverter by way of simplification in the shown case.

When conducting the IDDQ test, a voltage is applied from outside of the chip to the pads for power supply 1701, 1702 and also to the pads for substrate bias 1703, 1704, at the same time. Generally, a device outside of the chip (such as an IC tester) has a high voltage supply capability, and therefore both the power supply voltage and the substrate bias can be settled at the desired value within a short time.

In packaging this chip, the pads for power supply are connected to the pins of the package by bonding or the like. The pads for substrate bias 1703, 1704, on the other hand, are not necessarily connected by bonding to the pins of the package, probably except in the case where the chip is required to be packaged and operated before the IDDQ test, for example.

Another solution to the problems according to the invention is to configure a voltage generating circuit built in the chip which can drive the substrate biases at high speed at the time of a test. In a specific method, two or more types of voltage generating circuits are prepared and one of them is used only for the IDDQ test. Taking advantage of the fact that the power consumption of the voltage generating circuits is negligible, the circuit is configured to stabilize the substrate bias voltage at a predetermined value at high speed. On the other hand, the voltage generating circuit used for reducing the current in the chip in standby mode is configured to consume less power. In this way, the voltage generating circuits are used differently for different purposes thereby to solve the problem (B) described above. Of course, a single voltage generating circuit having a plurality of operating functions can be used to process different applications according to the optimum operating specification.

The IDDQ test using the IDDQ current measurement method according to the invention described above makes it possible to check the chip, in various combinations with various test items (including the aging). According to this invention, however, the power supply voltage is reduced at the time of the IDDQ test below the power supply voltage (normal voltage) for normal operation of the chip, and the current is measured by applying a deeper substrate bias than for normal operation. To that extent, the combinations are not specifically limited. Further, the method of measuring the IDDQ current according to the invention can be carried out by lowering only the power supply voltage below normal voltage while keeping the substrate bias unchanged. In this way, the current can be measured without applying the substrate bias. In short, when measuring the current in the IDDQ test for chip selection, the power supply voltage and the substrate bias are adjusted in order to reduce the subthreshold leakage current flowing between the chip power supplies and the leakage current in the PN junction (including the GIDL current).

The power supply voltage value reduced at the time of the IDDQ test is such as not to erase the data stored in the memory circuit (a latch, a SRAM, a register or the like circuit for storing information) in the chip impressed with the particular power supply voltage. Generally, an excessively low power supply voltage would make it difficult to hold the stored data and instabilize the circuit operation, with the probable result that a current caused by another factor than the subthreshold leakage current may below between the power supply voltage terminals. This minimum voltage value is dependent also on the threshold voltage of the MOS transistor constituting the circuit, and therefore is not specifically limited herein. As long as a fault can be discriminated, a voltage value still lower than the minimum voltage can be used at which the data stored in the memory circuit are not erased.

Some chips operate at two or more power supply voltages in normal mode. When conducting the IDDQ test or each power supply voltage, the currents of all the power supplies can be measured either at the same time, one by one, or several of them sequentially at a time, using the various methods of the invention described above.

Figure 18:
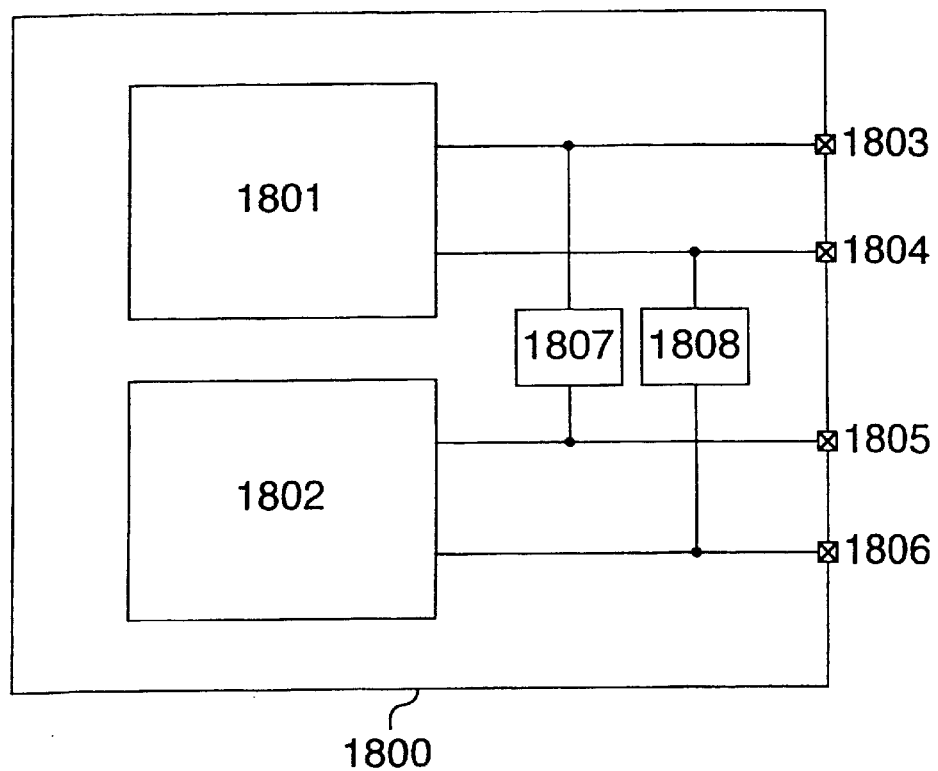
FIG. 18 is a diagram showing the structure of a chip supply power voltage terminal according to an embodiment of the invention.

Further, some chips include therein a circuit such as a current source in which a small amount of current flows between the power supply terminals also in normal operation mode (such a current will hereinafter be called the steady current). In such a case, the current due to a fault and the steady current cannot be distinguished from each other, and therefore the IDDQ test cannot exhibits normal functions. Then, the chip is configured as shown in FIG. 18. In FIG. 18, numeral 1800 designates such a chip. A circuit group 1801 is where the steady current described above flows, and a circuit group 1802 is where no steady current flows. The pads for power supply 1803 and 1804 are connected to the circuit group 1801, and the pads for power supply 1805 and 1806 are connected to the circuit group 1802. Numerals 1807, 1808 designate semiconductor switches. In FIG. 18, only one pad of each type is shown for simplicity's sake, but the number of the pads of each type is not specifically limited. Also, the connection of the terminals related to the substrate bias can be similar to the one in FIGS. 1 to 17 and therefore is not shown.

At the time of the IDDQ test, the switches 1807, 1808 are turned off, and the IDDQ current measurement according to the invention is conducted using the pads for power supply 1805, 1806 (at the same time, a predetermined voltage is of course applied also to the pads for power 1803, 1804). In this way, the IDDQ test is made possible for the chip 1800 without being affected by the circuit 1801 in which the steady current flows.

At other than the time of the test, on the other hand, the pads for power supply 1804, 1806 are connected by turning on the switch 1808, and so are the pads for power supply 1803, 1805 by turning on the switch 1807. Alternatively, the pads for power supply 1804, 1806 and the pads for power supply 1803, 1805 can be connected outside the chip by bonding or on a printed circuit board (PCB) without using the switches 1807, 1808. However, they had better be connected with a low resistance using a switch in the chip as shown in FIG. 18, because it is possible to prevent the noise-caused deviation of the power supply voltage level of the circuits 1801, 1802, and thus a malfunction and an increased power consumption can be avoided.

The configuration of the switches 1807, 1808 is not specifically limited but may be include a CMOS switch. Also, as far as the pad for power supply 1803 is on the positive power supply (vdd) side and the pad for power supply 1804 is on the negative power supply side (vss), the switch 1807 is preferably configured with a PMOS and the switch 1808 with a NMOS. The method of controlling these switches is not specifically limited.

In FIG. 2, the voltage boosted by the DC—DC converter DC1 and stepped down by the DC—DC converter DC2 is supplied as a vdd voltage. As an alternative, the DC—DC converter DC2 can be so configured as to boost or step down the voltage from the battery BAT1 directly to generate the vdd voltage. In such a case, the vdd voltage can be obtained through one step of the DC—DC converter from the battery BAT1 and therefore a highly efficient voltage conversion is possible.

Figure 13:
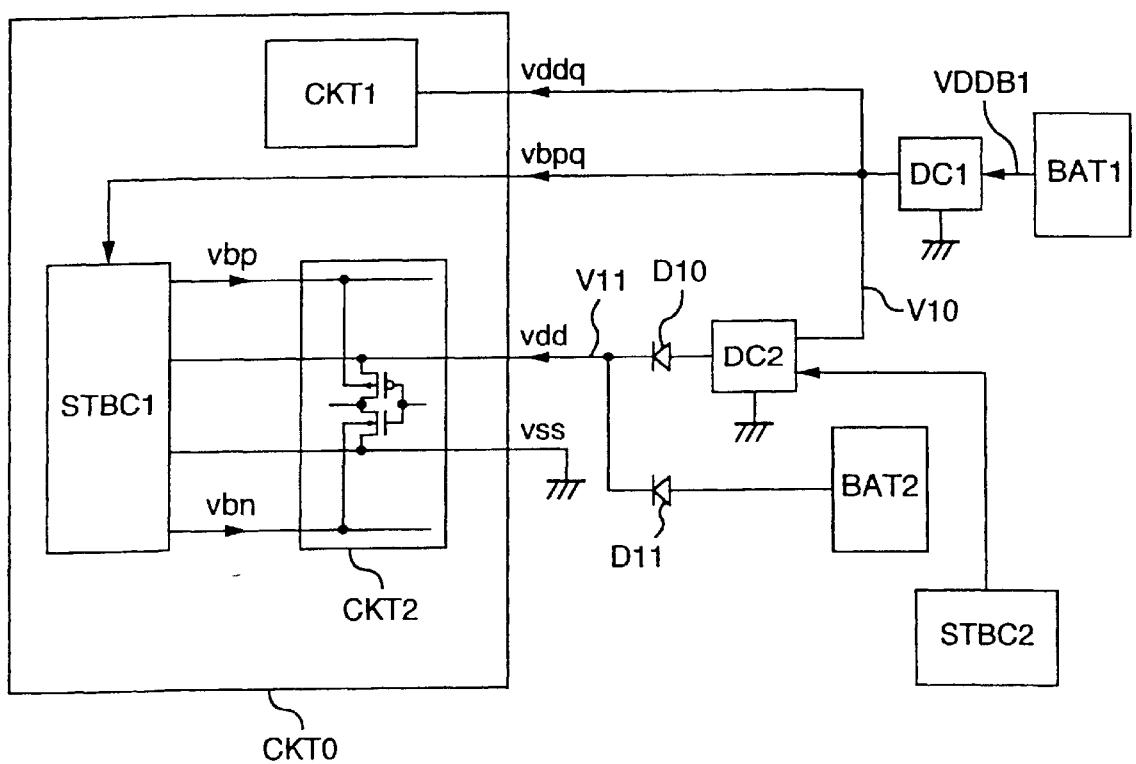
FIG. 13 is a diagram showing the power supply voltage control means different from FIG. 6.

FIG. 13 shows another embodiment different from FIG. 2. The reference characters BAT2 designate a battery, which is different from that of FIG. 2 in that power is supplied as vdd in standby mode not from the DC—DC converter DC1 but from the battery BAT2. In standby mode, the power supply voltage for the circuit CKT0 is supplied from a battery other than the battery BAT1. Thus, a battery with a smaller open-circuit voltage can be used as the battery BAT2. The battery BAT2, though not specifically limited, is suitably a nickel-hydrogen battery or a nickel-cadmium battery from the viewpoint of the open-circuit voltage thereof.

The means for realizing the standby mode 2 or the standby mode 3 according to the invention is not limited to the configuration of FIG. 2 or 13. In a method of switching the power supply voltage using a path including the DC—DC converter DC2 and the diode D10 and a path including the diodes D11 to D14 of FIG. 2, for example, a similar purpose can be achieved by providing the DC—DC converter DC2 with the function of switching the output voltage.

Figure 14A:
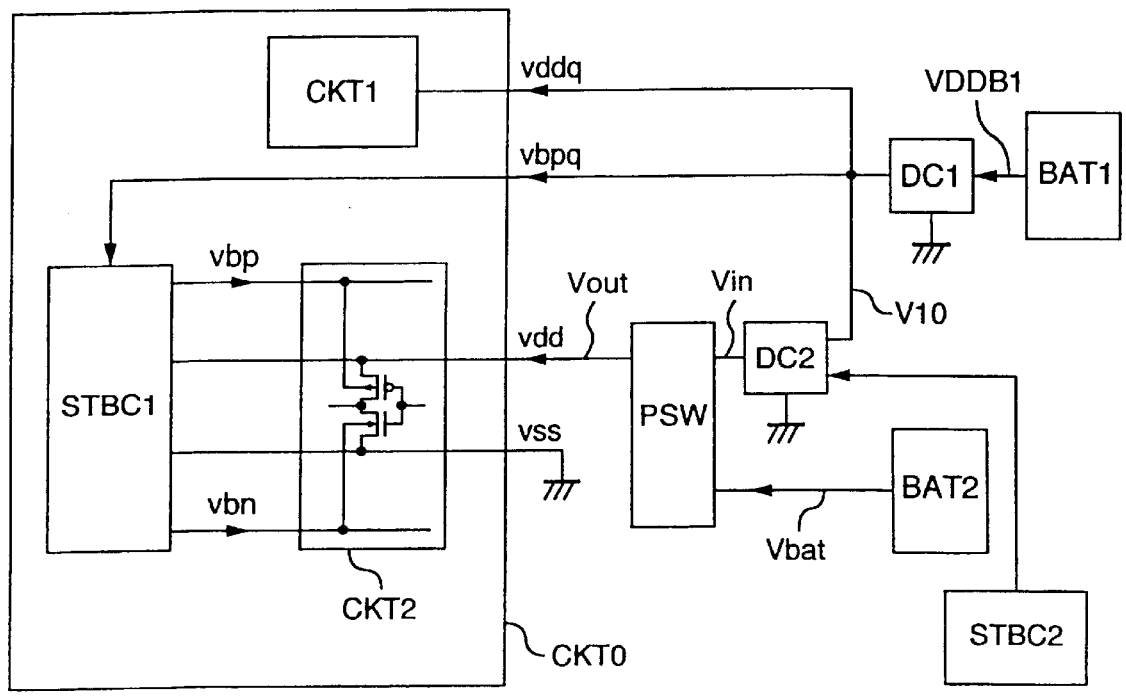
FIGS. 14A, 14B are diagrams showing the power supply voltage control means different from FIG. 6.
Figure 14B:
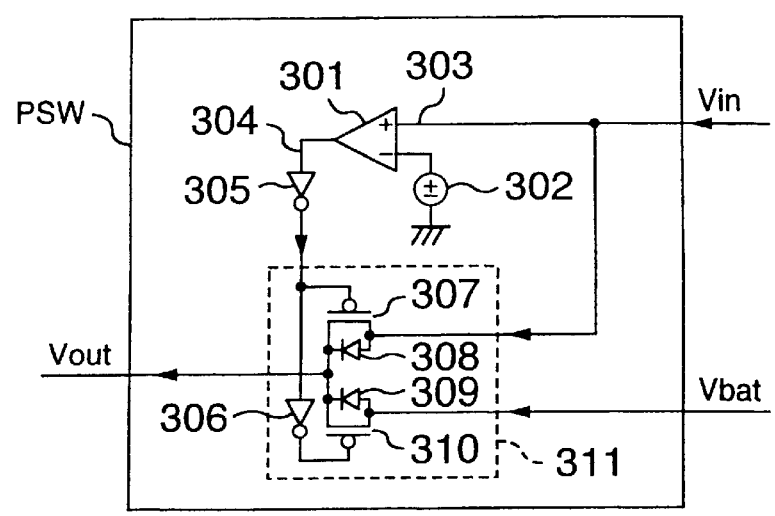

Such an embodiment is shown in FIGS. 14A, 14B. In FIG. 14A, the diode switch shown in FIG. 13 is replaced with a supply voltage switch PSW. The supply voltage switch PSW causes the shorting between vin and Vout when the voltage Vin is higher than a predetermined reference voltage. When the voltage Vin is lower than the predetermined reference value, on the other hand, Vbat and Vout are shorted with each other. This method can be implemented automatically in the same manner as when a diode switch is used for switching the supply voltage.

FIG. 14B shows an embodiment of the supply voltage switch PSW. Numeral 301 designates a comparator, numeral 302 a reference voltage generator, numerals 305, 306 inverters, numerals 307, 310 PMOS transistors, and numerals 308, 309 diodes. The voltage value Vin is compared with the output of the reference voltage generator 302 in the comparator 301, which outputs the result of comparison. According to the result of this comparison, either the PMOS transistor 307 or 310 is turned on. The diodes 308, 309 are used as a bypass in the case where a current beyond the current drive capacity of the PMOS transistor flows. The PMOS transistor which requires a certain current drive capacity may be a bipolar transistor if usable in the fabrication process. In the method of FIG. 2 using a diode switch, the problem is the voltage drop vf across the diode. Such a problem is not encountered in the method of FIG. 14.

Figure 15:
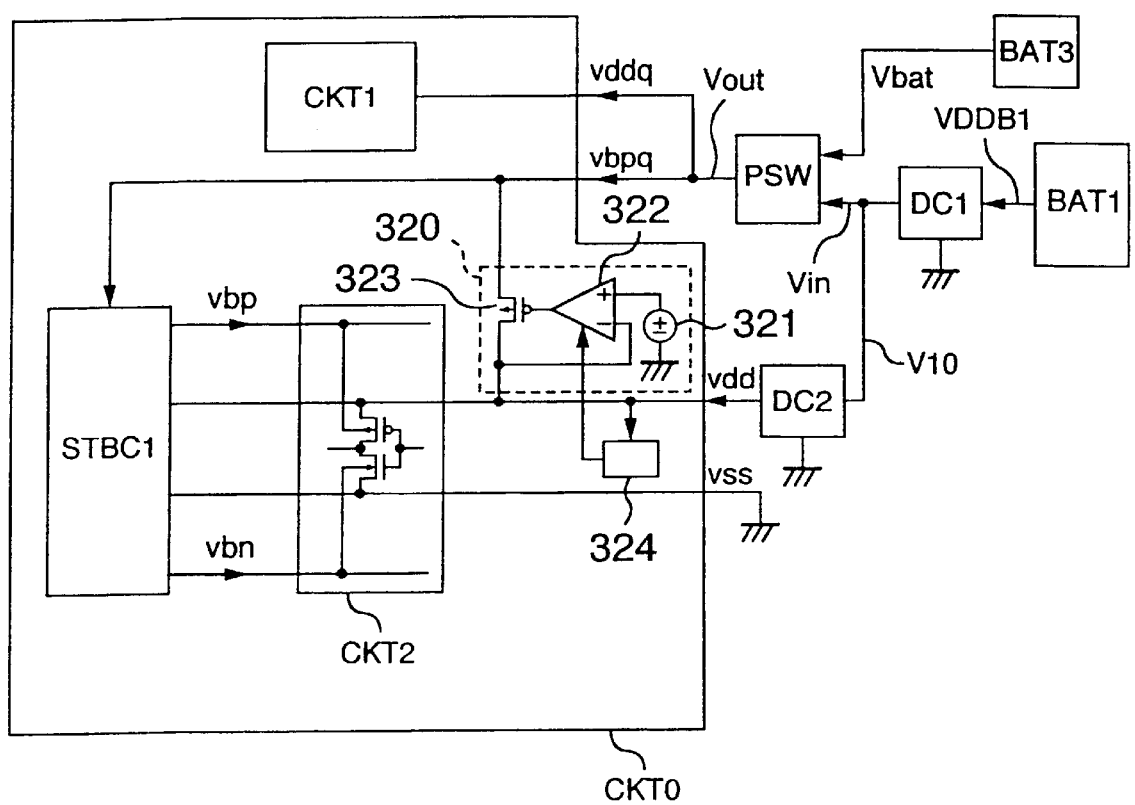
FIG. 15 is a diagram showing the power supply voltage control means different from FIG. 6.

FIG. 15 shows still another embodiment. This embodiment is configured with two batteries BAT1, BAT3. In active mode, the battery BAT1 is used, and in standby mode, the battery BAT3 is used. The circuit CKT0 has built therein a power supply circuit 320 for generating a power supply voltage for the circuit CKT2 in standby mode. The power supply circuit 320 includes an operational amplifier 322, a PMOS transistor 323 and a reference voltage generator 321. In this case, the output voltage of the reference voltage generator 321 is 0.9 V. Numeral 324 designates a vdd voltage monitor. When vdd is not lower than 0.9 V, the operation of the power supply circuit 320 is turned off, while when vdd is not less than 0.9 V, the power supply voltage circuit 320 is turned on. The supply voltage switch PSW is as shown in FIG. 14B.

In FIG. 15, as compared with FIG. 2, the standby control circuit STBC2 is not included, the standby mode is controlled by the power voltage supplied from the DC—DC converter DC1. Specifically, in active mode, the power supply voltage from the battery BAT1 is boosted or stepped down by the DC—DC converter DC1 into a stable voltage of 3.3 V, after which it is supplied to vddq and vbpq through the supply voltage switch PSW. Also, the output of the DC—DC converter DC1 is input also to the DC—DC converter DC2, where it is stepped down to 1.8 V and supplied as vdd to the circuit CKT0. The vdd voltage monitor 324 monitors the voltage vdd, which is not lower than 0.9 V and therefore the power supply voltage 320 is in off state.

In standby mode, on the other hand, power voltage is stopped being supplied from the DC—DC converter DC1. As a result, the supply voltage switch PSW shorts the output Vbat of the battery BAT3 and Vout so that the power voltage of the battery BAT3 is supplied to vddq and vdpq. Also, since power voltage ceases to be supplied to the DC—DC converter DC2, the power voltage also ceases to be supplied to vdd from the DC—DC converter DC2. The vdd voltage monitor 324 monitors the vdd voltage, and when vdd drops to 0.9 V or less, turns on the power voltage supply circuit 320. As a result, vdd is supplied with the same voltage of 0.9 V as the output voltage of the reference voltage generator 321 from the PMOS transistor 323. The battery BAT3, though not specifically limited, is suitably composed of a lithium battery from the view point of the open-circuit voltage and the energy density thereof.

The power supply voltage circuit 320 requires no coil or the like and therefore is easy to form into an integrated circuit. Assuming that the circuit CKT0 constitutes one semiconductor chip, no special power voltage supply circuit is required for use in standby mode other than the circuit CKT0. Also, as in FIG. 14, as compared with the method of FIG. 2 using a diode switch, the advantage is that the problem of the voltage drop Vf across the diode is done without.

In FIGS. 2 and 14A, the standby control circuit STBC2, though described as a circuit external to the circuit CKT0, may be provided in the CKT0. In such a case, the power supply voltage thereof is changed by the signal from the circuit CKT0. The standby control circuit STBC2 can alternatively be built in the circuit CKT1. The power supply voltage of the circuit CKT1 does not change as much as the vdd voltage, and therefore the circuit design of the circuit CKT1 is easy. Also, a power supply voltage provided in the circuit CKT0 separate from vdd can of course be supplied to the standby control circuit STBC2.

Various configurations other than the embodiments shown in FIGS. 2, 13, 14A, 14B, 15 described above are possible. Another embodiment will be explained below based on the configuration of FIG. 2. The configuration is not specifically limited as long as a deeper substrate bias is applied and a low power consumption is realized in standby mode than in active mode, as a power saving mode for reducing the power supply voltage supplied to the circuit.

Figure 6:
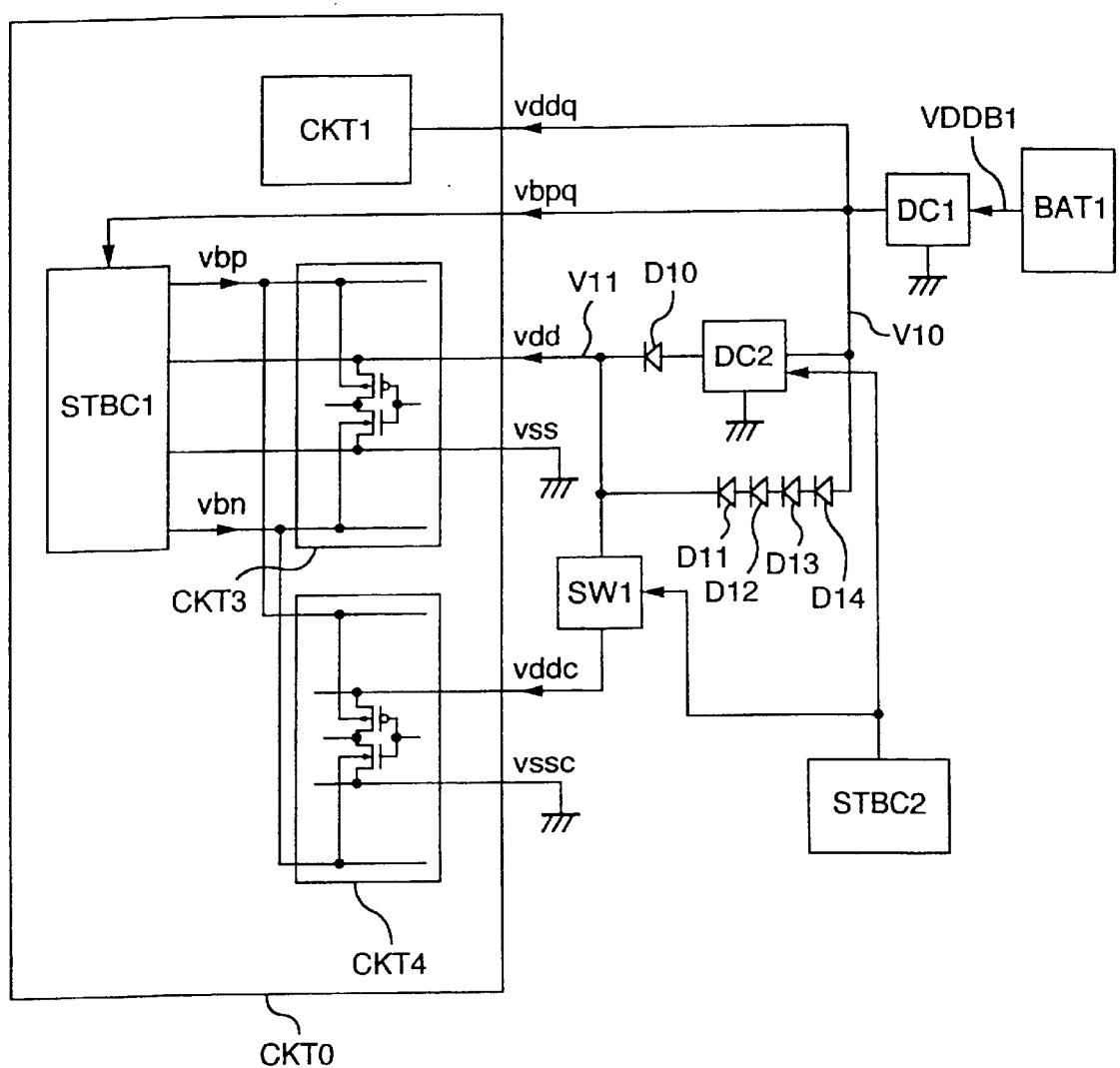
FIG. 6 is a diagram showing the embodiment of FIG. 2 comprising power supply voltage control means.

FIG. 6 shows an embodiment including the circuit CKT2 of FIG. 2 separated into a circuit CKT3 and a circuit CKT4. In the circuit CKT3, when the power supply voltage is turned off in standby mode, the information thus far held in the circuit is erased posing a stumbling block to the transition to active mode upon restoration of the power supply voltage. The circuit CKT4 is free of such inconvenience.

In standby mode, the circuit CKT4 free of the trouble by the turning off the power supply voltage is supplied with the power supply voltage vddc through the power supply switch SW1. The power supply switch SW1 is controlled by the standby control circuit STBC2. When the power switch SW1 is turned off in standby mode, the power voltage supply for the circuit CKT4 is cut off. As a result, the power consumption due to the subthreshold leakage current flowing in the circuit CKT4 can be reduced.

An output fixable circuit and an input fixable circuit are required in the interface between the circuit CKT3 and the circuit CKT4 in order to prevent the malfunction of the circuit CKT3 in on state when the power supply voltage of the circuit CKT3 is turned off in standby mode. This is easily realized by using a NAND, a NOR or other CMOS circuits, and therefore will not be described here.

The subthreshold leakage current in standby mode is reduced by use of the method of FIG. 1 according to the invention and this method is combined with a method of turning off the power supply voltage of the circuit without posing any problem as in the method of FIG. 6, thereby achieving a further reduced power consumption for the system as a whole.

Figure 7:
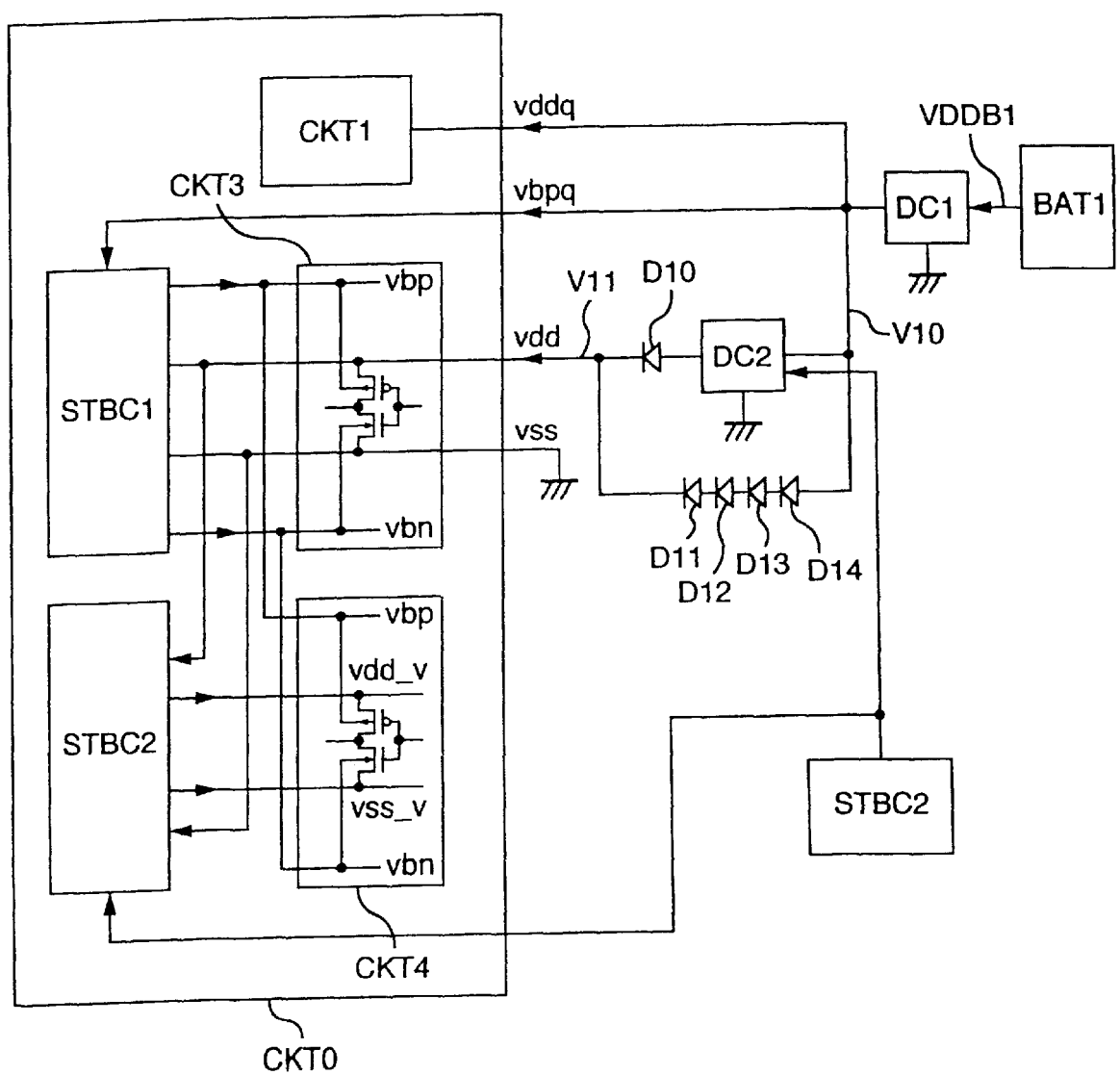
FIG. 7 is a diagram showing the power supply voltage control means according to an embodiment different from FIG. 6.

FIG. 7 shows an embodiment in which the power supply voltage switch SW1 of FIG. 6 is included in the circuit CKT0. Characters STBC2 designate a standby power supply voltage control circuit for controlling the power supply voltages vdd_v and vss_v of the circuit CKT4. In standby mode, voltages of 1.0 V and 0.8 V, for example, are applied as the power supply voltages vdd_v and vss_v, respectively, of the circuit CKT4. Since the potential difference of only 0.2 V is applied to the circuit CKT4, the information stored in the circuit CKT4 is not maintained, but the subthreshold leakage current flowing in the circuit CKT4 can be remarkably reduced. Also in the case of FIG. 6, 0.9 V is applied as vdd_v and vss_v in similar manner to FIG. 6 to turn off the power voltage completely.

Figure 8:
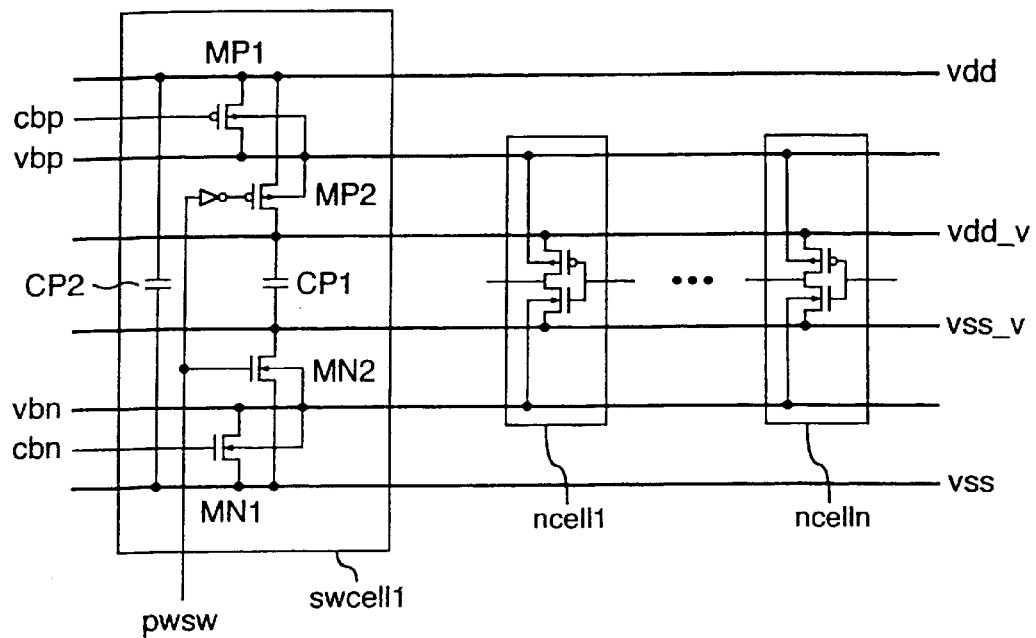
FIG. 8 is a diagram showing power supply voltage control means according to a more specific embodiment.

FIG. 8 shows an embodiment showing a method of realizing the circuit CKT4 and the standby power supply voltage control circuit STBC2. Characters ncell1 to ncelln designate CMOS logic circuits with the substrate biases thereof connected to vbp and vbn, respectively. Also, the power voltage terminals of the cells are connected to the virtual power supply voltages vdd_v and vss_v, respectively. One of the CMOS logic circuits (standard cells) ncell or a combination thereof corresponds to the circuit CKT4. Also, the switch cell (power supply voltage control means) swcell constitutes a part of the standby power supply voltage control circuit STBC2.

In the switch cell swcell, the PMOS substrate bias vbp and the NMOS substrate bias vbn are connected to the power supply voltages vdd and vss through the MOS transistors MP1 and MN1, respectively. As long as the PMOS substrate control signal cbp and the NMOS substrate control signal cbn are "L" and "H", respectively, therefore, the power supply voltage is applied to the substrate biases vbp, vbn. Also, when the PMOS substrate control signal cbp and the NMOS substrate control signal cbn are "H" and "L", on the other hand, the vbp and vbn voltages are supplied from an external circuit not shown in FIG. 8.

On the other hand, the virtual power supply voltages vdd_v and vss_v are connected to the power supply voltages vdd and vss, respectively, through the MOS transistors MP2 and MN2. When the supply voltage switch control signal pwsw is "H", therefore, the virtual power supply voltages vdd_v and vss_v are connected to the power supply voltages vdd and vss, respectively. When the supply voltage switch control signal pwsw is "L", on the other hand, the virtual power supply voltages vdd_v and vss_v assume a high impedance state, so that the voltages thereof are determined by the leakage current of the circuit connected between the virtual power supply voltages vdd_v and vss_v.

In FIG. 8, CP1 and CP2 designate what are so-called bypass capacitors or decoupling capacitors used for reducing the fluctuations of the power supply voltage. These bypass capacitors may be done without, although the bypass capacitor CP1 is effective for reducing the AC impedance of the vdd_v and vss_v.

Figure 9:
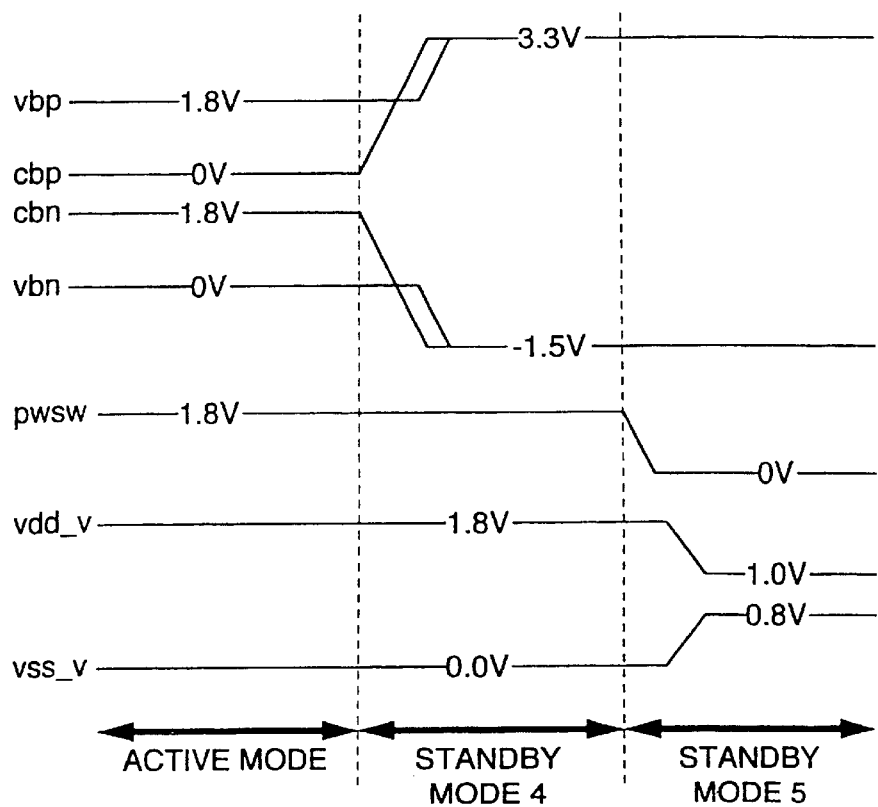
FIG. 9 is a diagram showing control waveforms for FIG. 8.

FIG. 9 shows operating waveforms according to an embodiment. In active mode, the PMOS substrate control signal cbp and the NMOS substrate control signal cbn are 0 V and 1.8 V, respectively, and the power supply voltages 1.8 V and 0 V are applied as the substrate biases vbp, vbn. In the process, the supply voltage switch control signal pwsw is 1.8 V, so that the power supply voltages 1.8 V and 0 V are supplied as the virtual power supply voltages vdd_v and vss_v, respectively.

In standby mode 4, on the other hand, voltages of 3.3 V and −1.5 V are applied as the PMOS substrate control signal cbp and the NMOS substrate control signal cbn, and voltages 3.3 V and −1.5 V are applied as vbp and vbn, respectively. The substrate bias of the MOS transistors in the circuits of the standard cells ncell1 to ncelln become deeper, and the threshold voltage increases due to the substrate bias effect, thus reducing the subthreshold leakage current.

In standby mode 5, in addition to the conditions for standby mode 4, the supply voltage switch control signal pwsw becomes 0 V. As a result, the virtual power supply voltages vdd_v and vss_v are released from the power supply voltages vdd and vss, respectively. Thus, the virtual supply voltages vdd_v and vss_v assume a value (1.0 V and 0.8 V, respectively, in this case) determined by the leakage current, etc. The substrate bias of the MOS transistors in the circuits of the standard cells ncell1 to ncelln deepens and the threshold voltage increases due to the substrate bias effect. At the same time, the threshold voltage of the MOS transistors in the circuits of the standard cells ncell1 to ncelln increases considerably due to the DIBL phenomenon. In this way, the subthreshold leakage current can be considerably reduced.

In the case where the threshold voltage of the MOS transistors MP1, MP2, MN1, MN2, though not specifically limited, is set to a low level, the leakage current flows and therefore it becomes difficult to reduce the power consumption in general. For this reason, the use of a MOS transistor of high threshold voltage is recommended. The threshold voltage of the MOS transistors MP2 and MN2 increases, however, due to the fact that the substrate bias thereof is deepened in standby mode. As a result, MOS transistors of low threshold voltage can be used as the MOS transistors MP2, MN2.

The gate oxide films of the MOS transistors MP1 and MN1, on the other hand, are required to be increased in thickness more than the gate oxide film of the MOS transistors in the standard cell ncell1 in view of the fact that a high voltage is applied to the gate-source or gate-drain terminals in standby mode. The gate oxide film of the MOS transistors MP2 and MN2, on the other hand, can have the same thickness as the gate oxide film of the MOS transistors in the standard cell ncell1 because no high voltage is applied to the gate-source terminals or the gate-drain terminals.

Provision of a multiplicity of switch cells swcell1 of FIG. 8 makes it possible to connect the substrate biases vbp, vbn, the virtual power voltage supplies vdd_v, vss_v to the low-impedance power supply voltages vdd, vss, respectively, in active mode.

Figure 10:
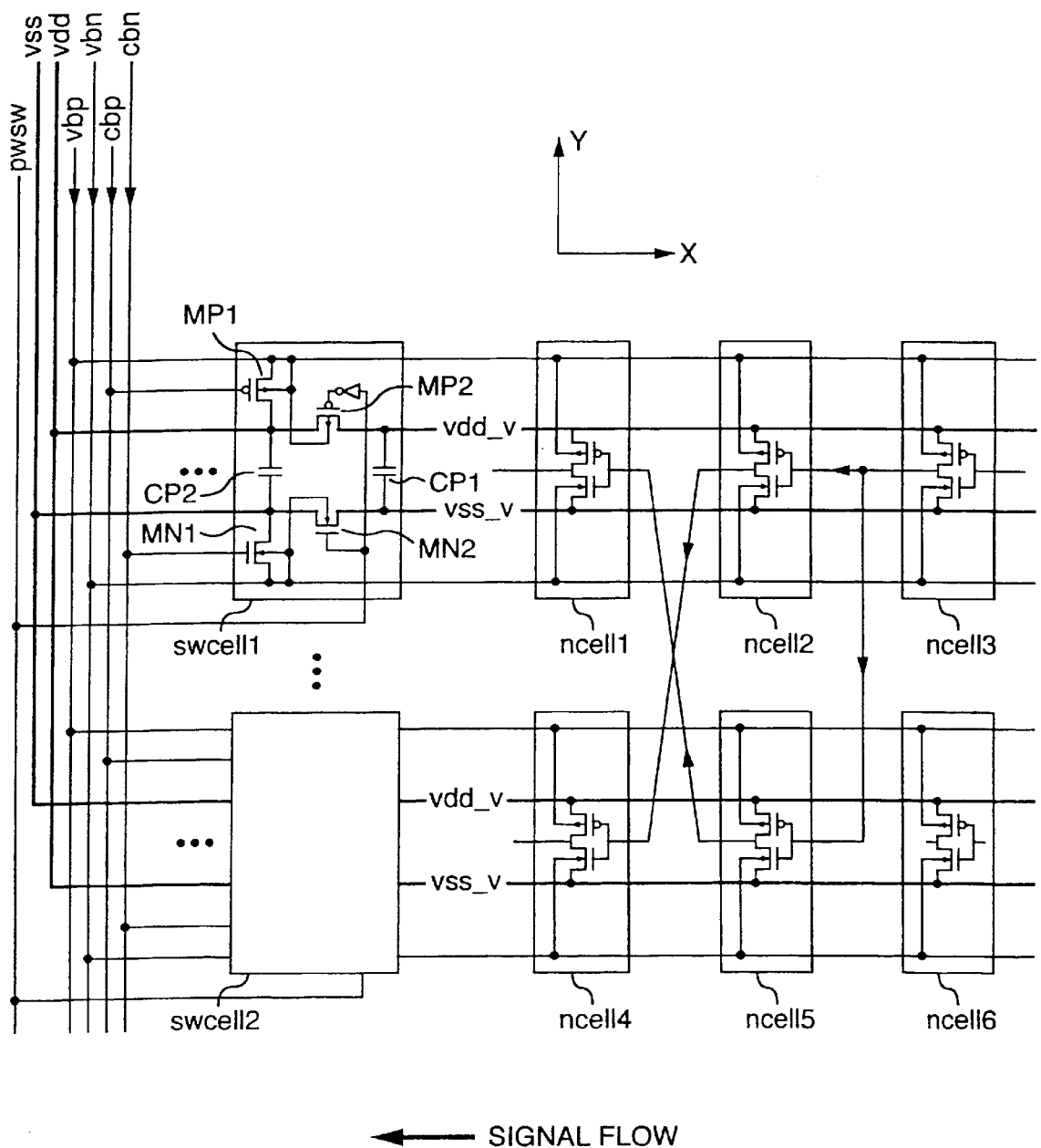
FIG. 10 is a diagram showing a method of efficiently arranging the swcell in FIG. 8 according to an embodiment.
Figure 11:
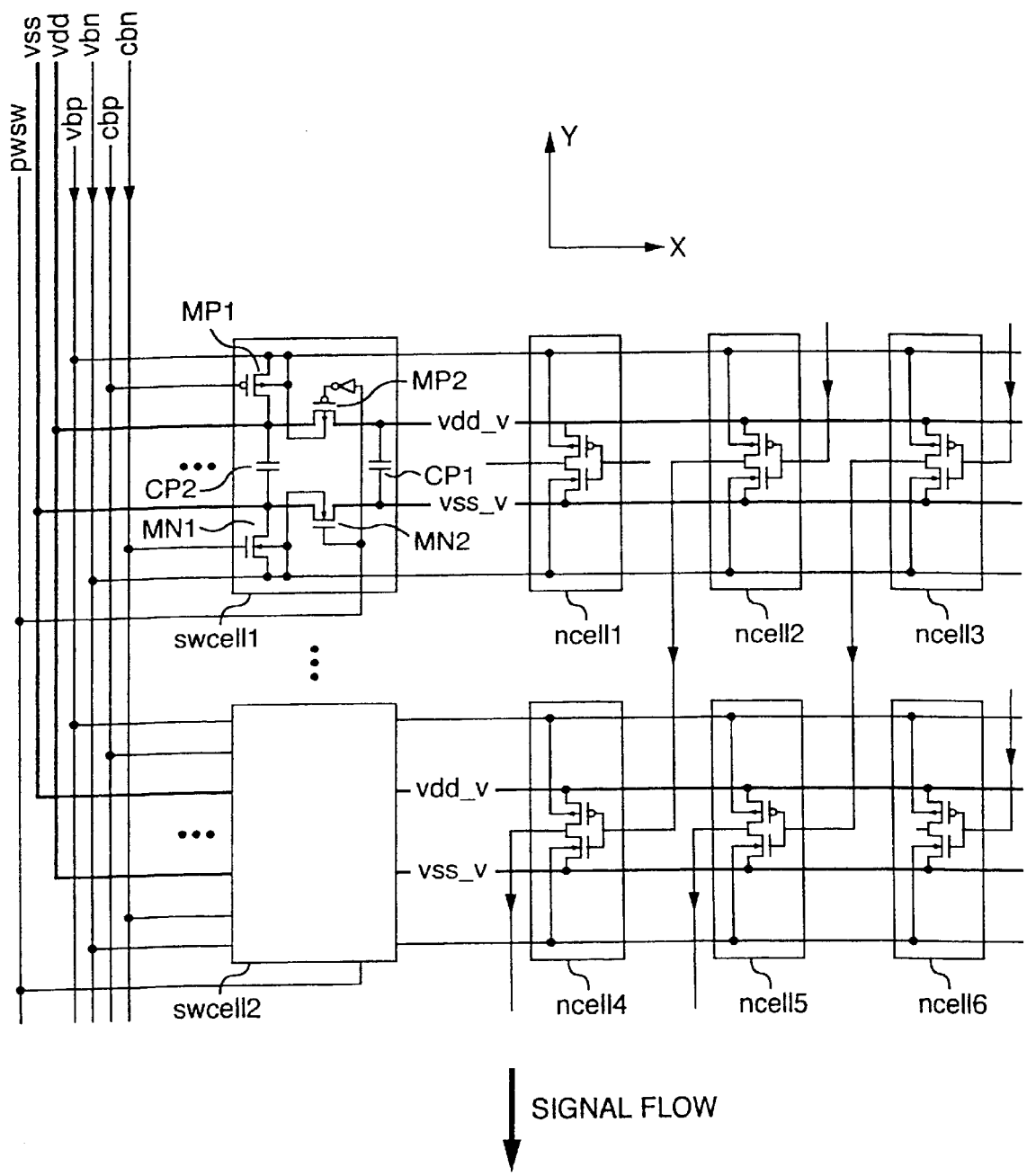
FIG. 11 is a diagram showing a method of inefficiently arranging the swcell in FIG. 8 according to an embodiment.

FIGS. 10 and 11 show a method of arranging the switch cells swcell1 according to an embodiment. The virtual power supply voltages vdd_v, vss_v provide power lines for the standard cells ncell1 to ncelln, and therefore the high-speed operation requires that the impedance of the virtual power supply voltages vdd_v, vss_v be as small as possible. By providing a multiplicity of switch cells swcell1, the impedance is correspondingly reduced. In spite of this, the number of switch cells that can be provided is limited. Further, provision of a multiplicity of switch cells swcell1 results in an increased space requirement.

FIG. 10 shows a method of arranging the switch cells swcell1 efficiently. In FIG. 10, the signal is assumed to flow in X direction. In FIG. 10, the standard cells ncell2, ncell5 or ncell1, ncell4 are operated at the same time, while the standard cells ncell2, ncell1 and ncell5, ncell4 are not operated at the same time. Therefore, among the circuits connected to one virtual power supply voltage vdd_v, vss_v, there are fewer circuits which are operated at the same time.

FIG. 11 shows another example. In FIG. 11, the signal processed is assumed to flow in Y direction. In FIG. 11, the standard cells ncell2, ncell3 or ncell4, ncell5 are likely to be operated at the same time. Thus, a multiplicity of the CMOS circuits connected to a single virtual power voltage vdd_v, vss_v are operated at the same time.

By designing the signal flow in the direction parallel to the virtual power voltage to avoid simultaneous operation of a multiplicity of CMOS circuits connected to a single virtual power supply voltage vdd_v, vss_v, the peak of the current flowing in the virtual power supply can be suppressed with the decrease in the current peak, the amount of power supply voltage bump generated can be reduced for the same power supply voltage impedance. Thus, in effective terms, therefore, the impedance of the virtual power voltage is reduced equivalently. From this viewpoint, the swcell1 arrangement of FIG. 11 is considered less efficient than that of FIG. 10.

The flow design of the power supply voltage net and the signal in FIG. 10 can be easily realized by appropriately designing the data path, for example. The signal flow in the data path is regular and therefore can be designed to be parallel to the virtual power supply voltage easily.

Figure 12:
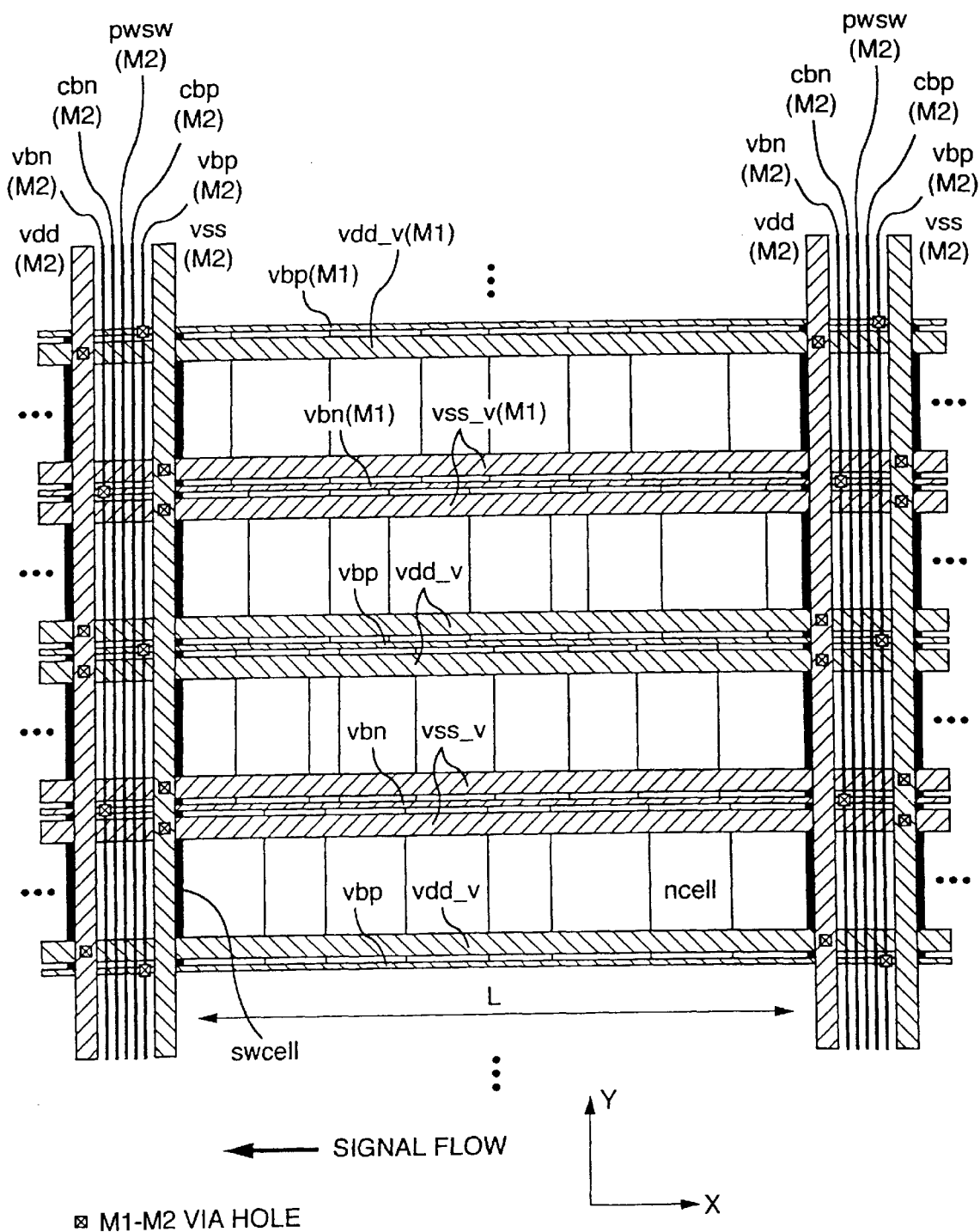
FIG. 12 is a diagram showing an example layout of a data path circuit using the embodiment of FIG. 8.

FIG. 12 shows an example layout of the power supply voltages vdd, vss, the substrate bias control lines vbp, vbn, cbp, cbn and the supply voltage switch control line pwsw. In the horizontal direction of the diagram, the lines vdd, vss, vbp, vbn wired by M1 (first metal level) are arranged in parallel, and in the vertical direction, the lines vdd, vss, vbp, vbn, cbp, cbn, pwsw wired by M2 (second metal level) are arranged. At the intersections between M1 and M2, vdd, vss, vbp, vbn are connected in mesh, respectively. The flow of the signal in the data path is set as indicated by signal flow arrow in the diagram. Thus, it is possible to reduce the number of the circuits connected to a single virtual power supply which are operated at the same time. The reference numerals in the diagram designate similar component parts as the corresponding ones designated in FIG. 11 and preceding diagrams.

The main effects of the invention are as follows:

(1) The increased power consumption due to the subthreshold leakage current in standby mode can be suppressed by the change of the threshold voltage caused by the substrate bias effect and the DIBL phenomenon.

(2) An effectively deep substrate bias can be applied to the MOS transistors without increasing the drain-well voltage or the well—well voltage of the MOS transistors.

While the present invention has been described above in conjunction with the preferred embodiments, one of ordinary skill in the art would be enabled by this disclosure to make various modification to this embodiment and still be within the scope and spirit of the invention as defined in the appended claims.

What is claimed is:

1. A semiconductor integrated circuit device comprising:
a first circuit including a first MOS transistor and a first memory circuit; and
a first power supply voltage control circuit supplying a first power supply voltage to the first circuit; and
a substrate bias control circuit supplying a first substrate bias voltage to the first MOS transistor;
a second circuit including a second memory circuit; and
a second power supply voltage control circuit supplying a second power supply voltage to the second circuit;
wherein in a first mode, the substrate bias control circuit controls the first substrate bias voltage to be a first voltage and the first power supply voltage control circuit controls the first power supply voltage to be a second voltage;
wherein in a second mode, the substrate bias control circuit controls the first substrate bias voltage to be a third voltage so that a subthreshold voltage of the first MOS transistor becomes higher than that in the first mode and the first power supply voltage control circuit controls the first power supply voltage to a voltage lower than the second voltage and sufficiently high for holding data of the first memory circuit; and
wherein in the second mode, the second power supply vohage control circuit controls the second power supply voltage to be lower than that in the first mode, so that data of the second memory circuit is erased.

2. The semiconductor integrated circuit device according to claim 1,
wherein the second memory circuit is at least one of a latch, an SRAM and a register.

3. A method of decreasing power consumption of a semiconductor integrated circuit device having a first circuit including a first MOS transistor and a first memory circuit and a second circuit including a second memory circuit, comprising:
changing a mode signal from a first mode to a second mode;

applying a first substrate bias voltage to the first MOS transistor;

applying a first power supply voltage to the first circuit; and applying a second power supply voltage to the second circuit;

wherein the first substrate bias voltage is deeper than a substrate bias voltage applied when the first circuit is in the first mode;

wherein the first power supply voltage is lower than a power supply voltage applied when the first circuit is in the first mode and sufficiently high for holding data of the first memory circuit; and wherein the second power supply voltage is lower than a power supply voltage applied when the second circuit is in the first mode, so that a data of the second memory circuit is erased.

4. The method of decreasing power consumption according to claim 3, wherein the second memory circuit is at least one of a latch, a SRAM and a register.

* * * * *